(12) United States Patent
Minamisawa

(10) Patent No.: US 10,845,611 B2
(45) Date of Patent: Nov. 24, 2020

(54) OPTICAL UNIT WITH SHAKE CORRECTION FUNCTION

(71) Applicant: NIDEC SANKYO CORPORATION, Nagano (JP)

(72) Inventor: Shinji Minamisawa, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 164 days.

(21) Appl. No.: 15/937,296

(22) Filed: Mar. 27, 2018

(65) Prior Publication Data

US 2018/0284476 A1 Oct. 4, 2018

(30) Foreign Application Priority Data

Mar. 30, 2017 (JP) .................. 2017-066747

(51) Int. Cl.
*G02B 7/02* (2006.01)
*G02B 27/64* (2006.01)
*G03B 5/06* (2006.01)
*H05K 1/14* (2006.01)
*H05K 1/02* (2006.01)

(52) U.S. Cl.
CPC .......... *G02B 27/646* (2013.01); *G02B 7/021* (2013.01); *G03B 5/06* (2013.01); *H05K 1/0274* (2013.01); *H05K 1/0281* (2013.01); *H05K 1/147* (2013.01); *G03B 2205/0023* (2013.01); *G03B 2205/0069* (2013.01); *H05K 2201/056* (2013.01);
(Continued)

(58) Field of Classification Search
CPC ........ G02B 27/64; G02B 27/646; G02B 7/00;
G02B 7/02; G02B 7/021; H05K 1/0274; H05K 1/0281; H05K 1/147; H05K 2201/10121; H05K 2201/10151; G03B 5/06; G03B 2205/0023; G03B 2205/0069; H04N 5/23248; H04N 5/23258; H04N 5/23287
See application file for complete search history.

(56) References Cited

U.S. PATENT DOCUMENTS 6,693,870 B2 * 2/2004 Koga .................. G11B 7/0925
369/116
7,650,065 B2 * 1/2010 Takahashi .......... H04N 5/23248
359/556
(Continued)

FOREIGN PATENT DOCUMENTS

WO 2015045791 A1 4/2015

*Primary Examiner* — Thong Q Nguyen
(74) *Attorney, Agent, or Firm* — Cantor Colburn LLP

(57) ABSTRACT

An optical unit with a shake correction function may include a movable body on which an optical module is mounted, a fixed body which supports the movable body, and a flexible printed circuit board connected with the movable body. The flexible printed circuit board comprises a fixed part fixed to the movable body and the fixed part is structured by fixing a reinforcing plate to the flexible circuit board. The fixed part comprises two engaging parts to which two protruded parts formed in the movable body are fitted and a hooked part formed of an end part of the reinforcing plate. The hooked part is protruded to an outer side in a width direction of the flexible circuit board. The movable body comprises the two protruded parts which are fitted to the two engaging parts and a first hook part which holds the hooked part.

20 Claims, 20 Drawing Sheets

(52) U.S. Cl.
CPC .............. *H05K 2201/10121* (2013.01); *H05K 2201/10151* (2013.01)

(56) References Cited

U.S. PATENT DOCUMENTS

| | | | |
|---|---|---|---|
| 8,279,289 B2* | 10/2012 | Nagata | G02B 27/646 |
| | | | 348/208.11 |
| 9,151,964 B2* | 10/2015 | Takei | G03B 5/00 |
| 2005/0266704 A1* | 12/2005 | Sudo | G11B 7/22 |
| | | | 439/67 |

\* cited by examiner

OPTICAL UNIT WITH SHAKE CORRECTION FUNCTION

CROSS REFERENCE TO RELATED APPLICATION

The present invention claims priority under 35 U.S.C. § 119 to Japanese Application No. 2017-066747 filed Mar. 30, 2017, the entire content of which is incorporated herein by reference.

FIELD OF THE INVENTION

At least an embodiment of the present invention may relate to an optical unit with a shake correction function which is structured to swing or turn an optical module having an optical element to correct a shake.

BACKGROUND

An optical unit which is mounted on a portable terminal or a movement body includes a mechanism structured to swing or turn an optical element to correct a shake for suppressing disturbance of a photographed image of a portable terminal or a photographed image during movement of a movement body. For example, an optical unit described in International Publication No. WO 2015-045791 includes a swing mechanism (shake correction drive mechanism) structured to swing an optical module having an optical element (imaging element) in a pitching (vertical swing/tilting) direction and a yawing (lateral swing/panning) direction so as to correspond to shakes in two directions, i.e., the pitching direction and the yawing direction.

In the optical unit described in the Patent Literature, a movable body on which the optical module is mounted is connected with a flexible printed circuit board. The flexible printed circuit board which is extended from the movable body is connected in a resiliently bent state with a connector part provided in a fixed body. In the above-mentioned Patent Literature, as a structure for fixing a flexible printed circuit board to a movable body, a structure is used in which a plate-shaped spacer is attached to a circuit board of an optical module, a clamp member is engaged with an end part of the spacer, and the flexible printed circuit board is sandwiched and held between the spacer and the clamp member.

However, in the fixing structure of the flexible printed circuit board described in the Patent Literature, the number of components is increased because the clamp member is used. Further, the flexible printed circuit board is fixed by sandwiching an elastic member between the clamp member and the flexible printed circuit board. However, according to this structure, a position of the flexible printed circuit board may be displaced. In addition, the clamp member is engaged with a hook provided in a side face of the spacer and thus, when a state that the clamp member is surely fixed is to be confirmed by visual inspection, the engaged portion is required to be confirmed from a direction different from an attaching direction of the clamp member to the spacer. Therefore, the confirming work is not easy.

SUMMARY

In view of the problems described above, at least an embodiment of the present invention may advantageously provide an optical unit with a shake correction function in which the number of components in a portion where the flexible printed circuit board is fixed to a movable body having an optical element is reduced and, in which a fixing work of the flexible printed circuit board is easily performed and a confirming work for the fixed state is easy.

According to at least an embodiment of the present invention, there may be provided an optical unit with a shake correction function including a movable body on which an optical module is mounted, a fixed body which supports the movable body, and a flexible printed circuit board which is connected with the movable body. The flexible printed circuit board includes a fixed part which is fixed to the movable body, the fixed part is structured by fixing a reinforcing plate to the flexible circuit board, the fixed part includes two engaging parts to which two protruded parts formed in the movable body are fitted and a hooked part formed of an end part of the reinforcing plate, and the hooked part is protruded to an outer side in a width direction of the flexible circuit board. The movable body includes the two protruded parts which are fitted to the two engaging parts and a first hook part which holds the hooked part.

According to at least an embodiment of the present invention, the flexible printed circuit board extended between the movable body and the fixed body is provided with a fixed part which is reinforced by a reinforcing plate, and the fixed part is provided with two engaging parts and a hooked part formed of an end part of the reinforcing plate which is protruded to an outer side in a width direction of the flexible circuit board. Further, the movable body is provided with two protruded parts which are fitted to the engaging parts and a first hook part which holds the hooked part. According to this fixing structure, when the fixed part is slid so that the reinforcing plate is inserted to the first hook part formed in the movable body and, in addition, the protruded parts formed in the movable body are fitted to the engaging parts, the flexible printed circuit board can be fixed. Therefore, fixing components different from the movable body and the flexible printed circuit board are not required to be used and thus the number of components is reduced. Further, a fixing work is easy and, in addition, when an engaging state of the first hook part with the hooked part is to be confirmed by visual inspection and, when a fitting state of the protruded part to the engagement hole is to be confirmed by visual inspection, the states can be confirmed from an upper side only by observing an attached portion in a state that the flexible printed circuit board is disposed on an upper side with respect to the movable body. Therefore, a fixed state is easily confirmed.

In at least an embodiment of the present invention, it is desirable that one of the two protruded parts is a second hook part which holds the reinforcing plate. According to this structure, in addition to the first hook part, the fixed part can be held by the second hook part. Therefore, the fixed part is further surely fixed.

In at least an embodiment of the present invention, it is desirable that each of the first hook part and the second hook part is provided with an abutting part which is capable of abutting with the reinforcing plate and a holding part which is protruded from the abutting part and that the holding parts of the first hook part and the second hook part are protruded to the same direction as each other. According to this structure, the reinforcing plate can be inserted to the first hook part and the second hook part in the same direction and thus, the fixing work is easy. Further, the reinforcing plate is positioned by abutting the reinforcing plate with the abutting part and thus positioning of the fixed part is easy.

In at least an embodiment of the present invention, it is desirable that positions of the first hook part and the second hook part are different from each other in a direction perpendicular to the width direction of the flexible circuit board. According to this structure, the reinforcing plate is hard to be disengaged from the first hook part and the second hook part. Further, the flexible printed circuit board can be prevented from being inclined with respect to the extended direction and the flexible printed circuit board can be prevented from being laterally displaced in a direction perpendicular to the extended direction.

In at least an embodiment of the present invention, it is desirable that the movable body includes a circuit board on which an electronic component of the optical module is mounted and a spacer which is fixed to the circuit board, and that the two protruded parts and the first hook part are formed in the spacer. According to this structure, a spacer is attached to the circuit board and the flexible printed circuit board is fixed to the spacer and thus the flexible printed circuit board can be fixed at a position close to the circuit board. Further, interference of an electronic component which is mounted on the circuit board with the flexible printed circuit board can be avoided.

In this case, it is desirable that the spacer is provided with a guide part along an outward shape of the circuit board, and that the spacer is attached to the circuit board in a state positioned by the guide part. According to this structure, positioning of the circuit board can be accurately and easily performed by the guide part.

Further, in this case, it is desirable that the two engaging parts are an elongated groove in a cut-out shape, which is formed by cutting out an edge of the reinforcing plate, and a circular engagement hole whose position is shifted with respect to the elongated groove in a direction perpendicular to the width direction of the flexible circuit board, and that the two protruded parts provided in the spacer are a second hook part, which is protruded to an opposite side to the circuit board and is structured so as to hold the reinforcing plate, and a columnar protruded part which is protruded to the opposite side to the circuit board and is engaged with the circular engagement hole in the reinforcing plate. According to this structure, the reinforcing plate is hard to be disengaged by the second hook part, and the circular engagement hole provided in the reinforcing plate and the columnar protruded part are engaged with each other and thereby the fixed part can be fixed in a state that the fixed part is positioned.

In at least an embodiment of the present invention, the spacer is fixed to one end of the circuit board, the flexible printed circuit board is extended from the one end of the circuit board and is turned around to the opposite side to the one end, and the fixed part is located at a position along the spacer. According to this structure, a portion of the flexible printed circuit board extended from one end of the circuit board just after being bent is fixed to the spacer provided in the one end of the circuit board. Therefore, a return force of the turned-around shape of the flexible printed circuit board which is going to return to its original shape can be prevented from being applied to a further extended portion from the fixed part.

In at least an embodiment of the present invention, it is desirable that the first hook part of the spacer is provided with an abutting part which is abutted with the reinforcing plate and a holding part which is protruded from the abutting part and, in a state that the reinforcing plate is abutted with the abutting part of the first hook part, the columnar protruded part is overlapped with the circular engagement hole and the circular engagement hole and the columnar protruded part are engaged with each other. According to this structure, the reinforcing plate is positioned by abutting the reinforcing plate with the abutting part and thus positioning of the fixed part is easily performed.

In at least an embodiment of the present invention, it is desirable that the flexible printed circuit board comprises a plurality of the flexible circuit boards. In comparison with a flexible circuit board having a wide width, when a plurality of flexible circuit boards divided in a width direction is used, the flexible circuit boards can be easily bent resiliently. Therefore, when the optical module is to be swung or turned, a resistance force of the flexible printed circuit board can be reduced.

In at least an embodiment of the present invention, it is desirable that the flexible printed circuit board comprises an optical module printed circuit board connected with the optical module and a drive mechanism printed circuit board which is connected with a drive mechanism structured to swing or turn the optical module, the fixed part is provided in the optical module printed circuit board and the drive mechanism printed circuit board is fixed to the movable body through the protruded part. According to this structure, the optical module printed circuit board and the drive mechanism printed circuit board can be fixed to the movable body by a common fixing structure (common protruded part) and thus the optical module printed circuit board and the drive mechanism printed circuit board can be extended around collectively.

In this case, it may be structured that the optical module printed circuit board comprises two pieces of the flexible circuit boards which are separated in the width direction of the optical module printed circuit board, and the drive mechanism printed circuit board is disposed between the two flexible circuit boards and is overlapped with the engaging parts formed in the reinforcing plate, the engaging parts being located between the two flexible circuit boards. According to this structure, the optical module printed circuit board and the drive mechanism printed circuit board can be extended around so as not to overlap with each other.

Further, in at least an embodiment of the present invention, the movable body includes a swing body on which the optical module having an optical element is mounted, a swing support mechanism structured to swingably support the swing body, and a holder which supports the swing body through the swing support mechanism. The two protruded parts and the first hook part are provided in the swing body, the optical module printed circuit board is provided with a power feeding line for the optical module and a signal line for outputting a signal from the optical module to an outer side, and the hooked part provided in the fixed part of the optical module printed circuit board is held by the first hook part provided in the swing body, and the two engaging parts are fitted to the two protruded parts, and thereby the optical module printed circuit board is fixed to the swing body. Specifically, the swing body includes a circuit board on which an electronic component of the optical module is mounted and a spacer which is fixed to the circuit board, the optical module printed circuit board is connected with the circuit board, and the spacer is structured in a substantially rectangular solid shape, the two protruded parts are provided at a substantially center in a longitudinal direction of the spacer in the substantially rectangular solid shape, and the first hook part is provided at both ends in the longitudinal direction of the spacer. The hooked parts protruded from both end parts of the reinforcing plate of the optical module printed circuit board are held by the first hook parts provided at the both ends of the spacer, and the two engaging parts provided in the fixed part of the optical module printed circuit board are fitted to the two protruded parts provided at the substantially center of the spacer, and thereby the optical module printed circuit board is fixed to the spacer.

In at least an embodiment of the present invention, the drive mechanism includes a magnetic swing drive mechanism having a swing drive coil held by the swing body and is structured to swing the swing body, and the drive mechanism printed circuit board is connected with the swing drive coil and is fixed by the two protruded parts formed in the spacer.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

An embodiment of an optical unit 1 to which the present invention is applied will be described below with reference to the accompanying drawings. In this specification, three-axes of "X", "Y" and "Z" are directions perpendicular to each other. One side in an "X"-axis direction is indicated with "+X", the other side is indicated with "−X", one side in a "Y"-axis direction is indicated with "+Y", the other side is indicated with "−Y", one side in a "Z"-axis direction is indicated with "+Z", and the other side is indicated with "−Z". The "Z"-axis direction is coincided with an axial line "L" direction (optical axis direction) of the optical unit 1. Further, the "−Z" direction is an anti-object side (image side) in the axial line "L" direction (optical axis direction) and the "+Z" direction is an object side in the axial line "L" direction (optical axis direction).

(Entire Structure)

Figure 1:
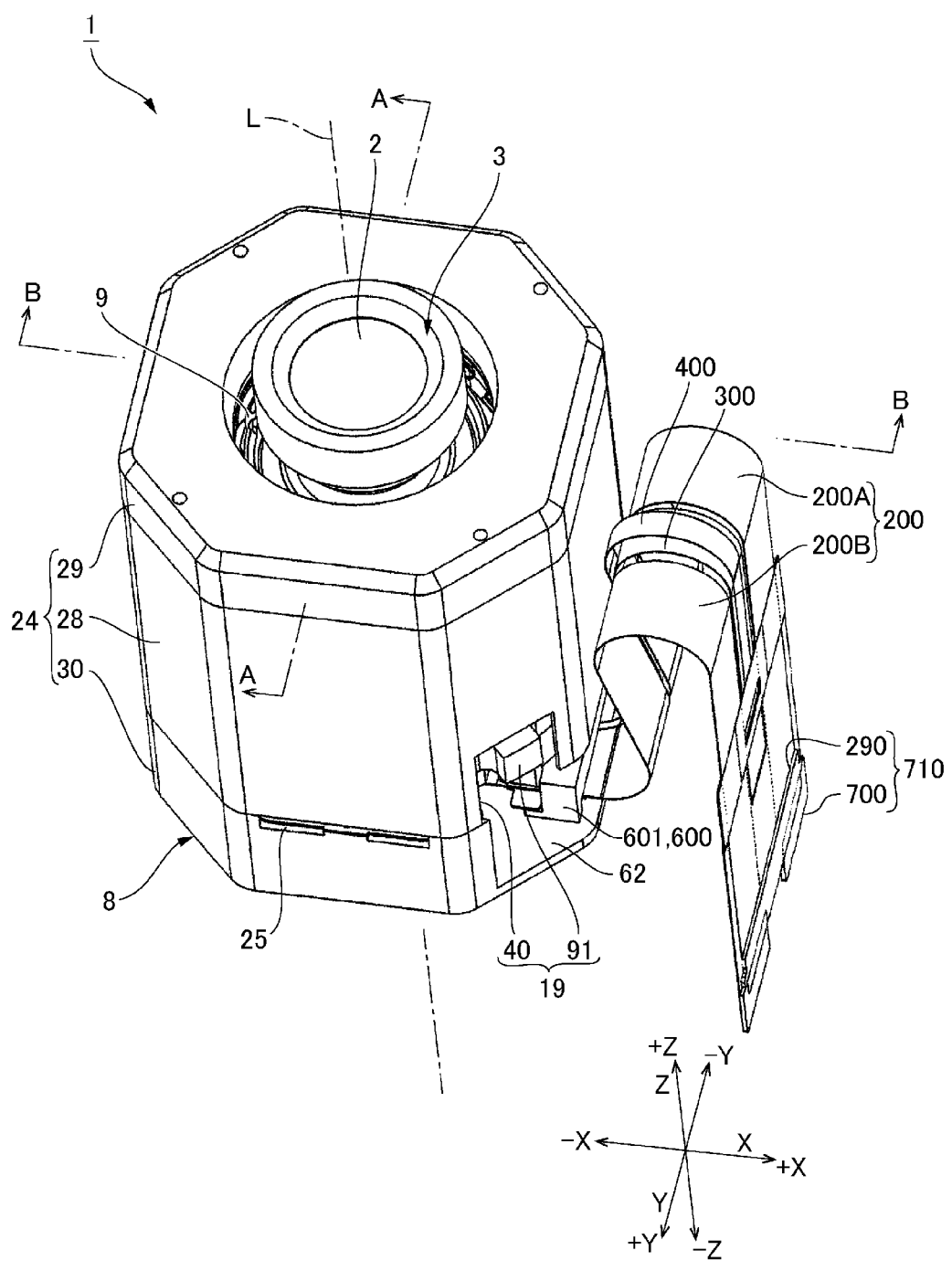
FIG. 1 is a perspective view showing an optical unit in accordance with at least an embodiment of the present invention which is viewed from an object side.
Figure 2:
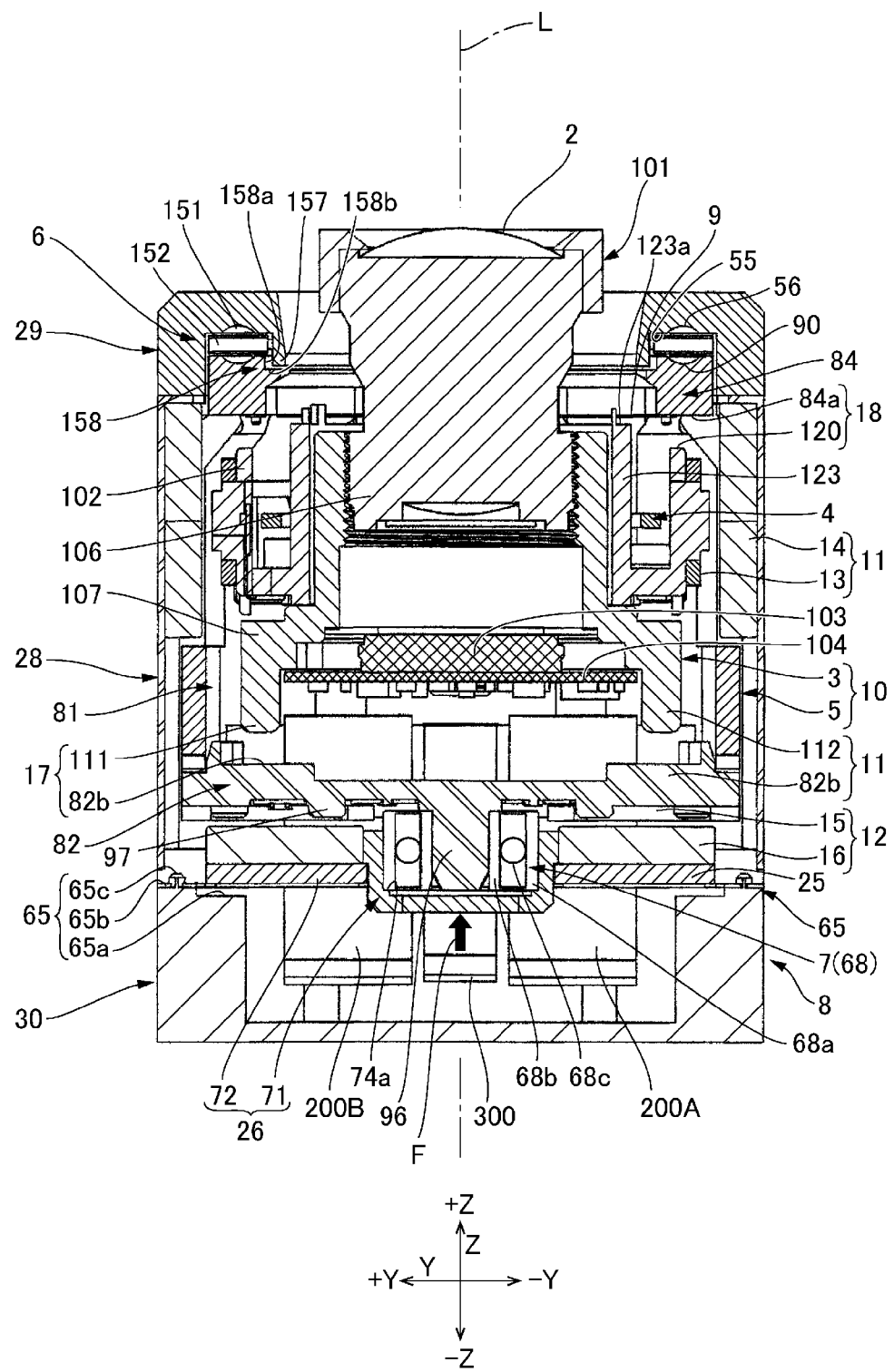
FIG. 2 is a cross-sectional view showing the optical unit which is cut by the "A-A" line in FIG. 1.
Figure 3:
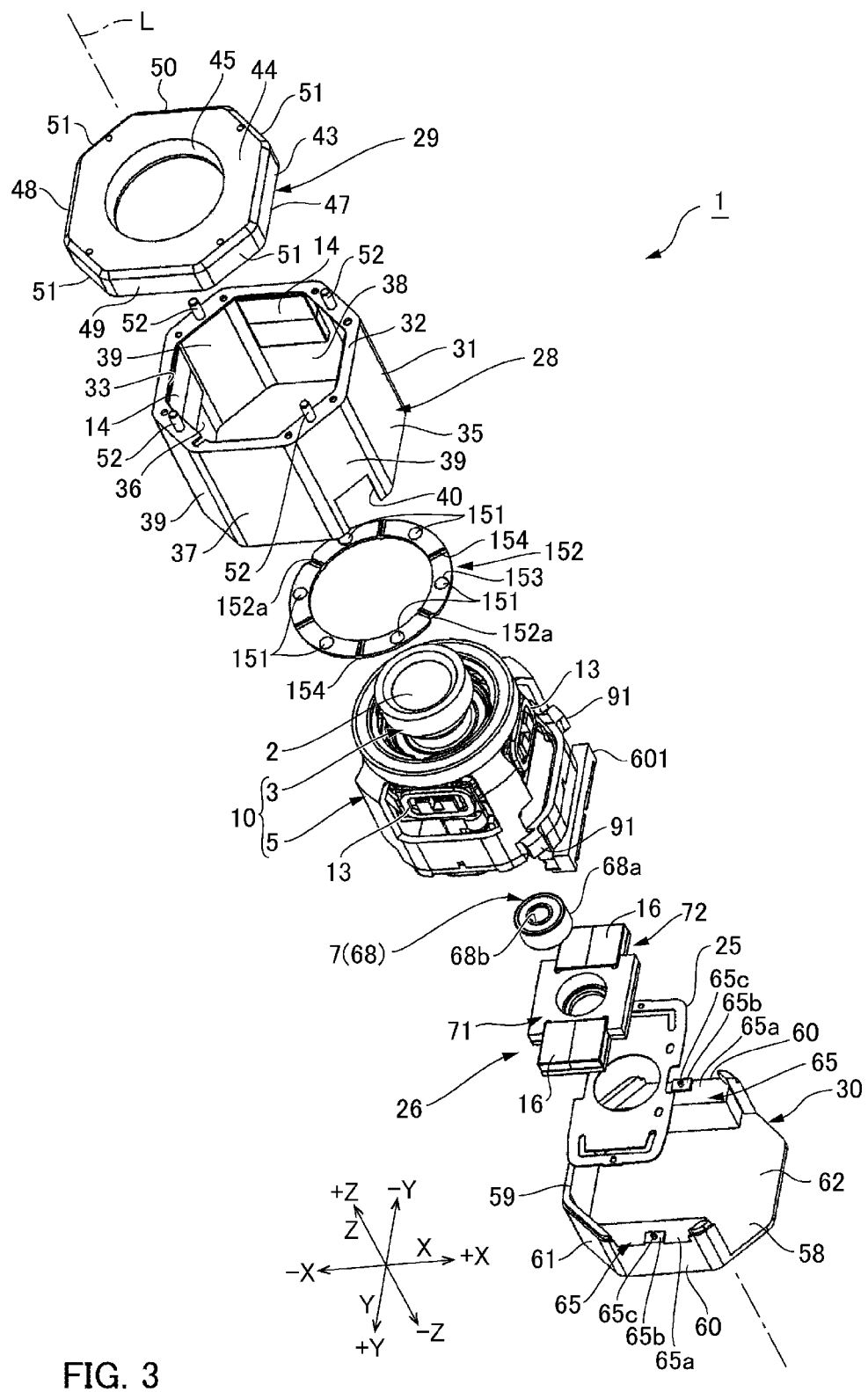
FIG. 3 is an exploded perspective view showing the optical unit in FIG. 1 which is viewed from an object side.
Figure 4:
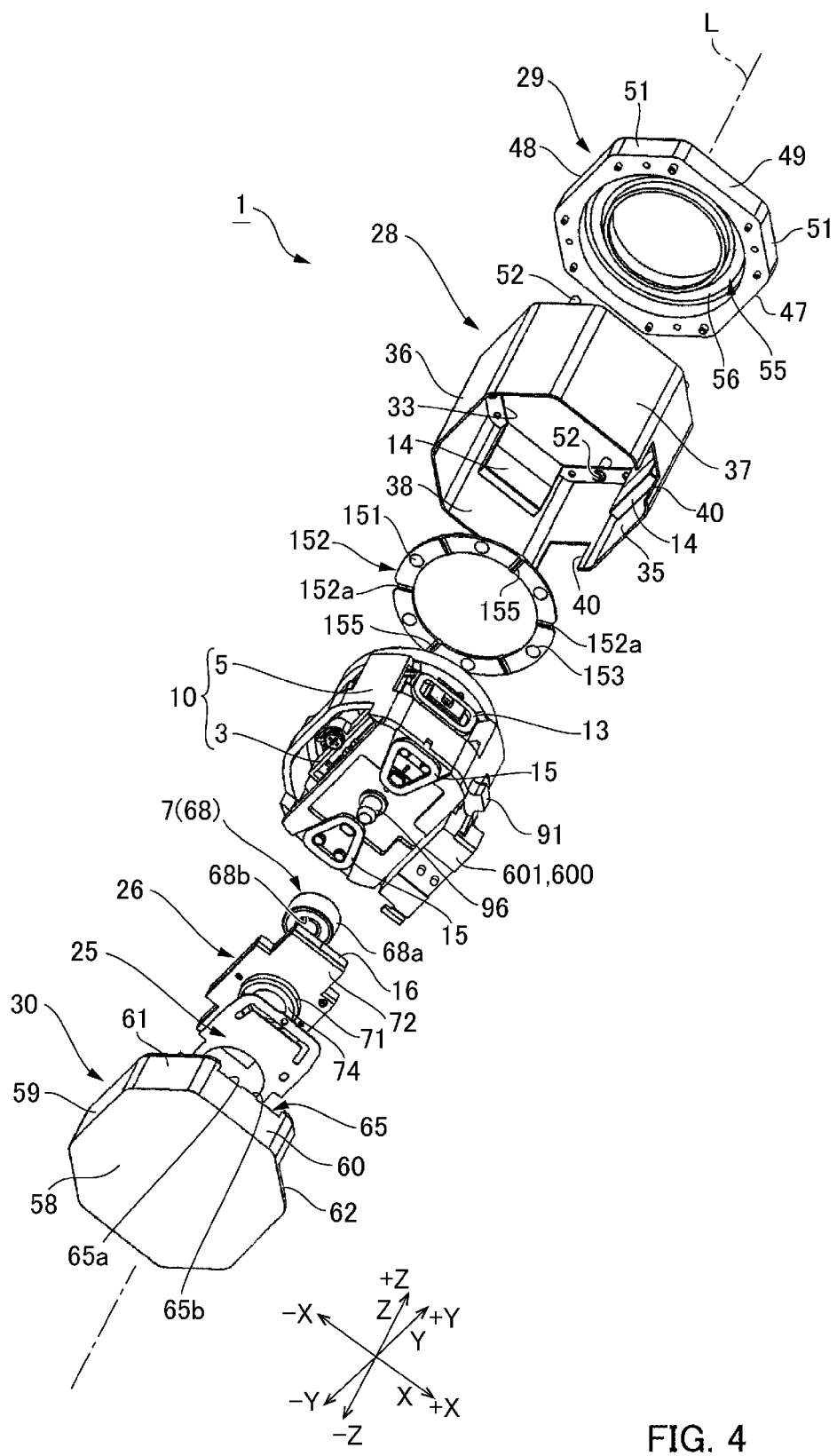
FIG. 4 is an exploded perspective view showing the optical unit in FIG. 1 which is viewed from an anti-object side.

FIG. 1 is a perspective view showing an optical unit 1 in accordance with at least an embodiment of the present invention which is viewed from an object side. FIG. 2 is a cross-sectional view showing the optical unit 1 which is cut by the "A-A" line in FIG. 1. FIG. 3 is an exploded perspective view showing the optical unit 1 in FIG. 1 which is viewed from an object side. FIG. 4 is an exploded perspective view showing the optical unit 1 in FIG. 1 which is viewed from an anti-object side (image side). An optical unit 1 shown in FIG. 1 is, for example, used in an optical device such as a cell phone with a camera or a drive recorder, or in an optical device such as an action camera mounted on a helmet, a bicycle, a movement body such as a radio-controlled helicopter, or a wearable camera. In the optical device, when a shake is occurred at the time of photographing, a disturbance is occurred in a photographed image. The optical unit 1 is an optical unit with a shake correction function which is structured to correct an inclination of an optical element 2 for avoiding an inclination of a photographed image.

As shown in FIG. 2, the optical unit 1 includes a swing body 3 on which a camera module 101 having an optical element 2 is mounted, a swing support mechanism 4 which swingably supports the swing body 3, and a holder 5 which supports the swing body 3 through the swing support mechanism 4. Further, the optical unit 1 includes a first turnable support mechanism 6 and a second turnable support mechanism 7 which turnably support the holder 5, and a fixed body 8 which supports the holder 5 through the first turnable support mechanism 6 and the second turnable support mechanism 7. In addition, the optical unit 1 includes a plate spring 9 which is provided between the swing body 3 and the holder 5.

The swing support mechanism 4 swingably supports the swing body 3 between a reference posture in which a predetermined axial line "L" and an optical axis of the optical element 2 are coincided with each other and an inclined posture in which the optical axis is inclined with respect to the axial line "L". The swing support mechanism 4 is a gimbal mechanism. The first turnable support mechanism 6 and the second turnable support mechanism 7 turnably support the holder 5 around the axial line "L". In other words, the first turnable support mechanism 6 and the second turnable support mechanism 7 turnably support a movable body 10 structured of the holder 5 and the swing body 3 swingably supported by the holder 5 around the axial line "L". The first turnable support mechanism 6 is structured between the fixed body 8 and the holder 5. The second turnable support mechanism 7 is located on a "−Z" direction side (anti-object side) with respect to the first turnable support mechanism 6. The plate spring 9 is provided for determining the reference posture of the swing body 3.

The optical unit 1 includes a magnetic swing drive mechanism 11 structured to swing the swing body 3 and a magnetic rolling drive mechanism 12 structured to turn the holder 5 (movable body 10). The magnetic swing drive mechanism 11 includes swing drive coils 13 which are held by the swing body 3 and swing drive magnets 14 which are held by the fixed body 8. The swing drive coil 13 and the swing drive magnet 14 face each other in a radial direction perpendicular to the axial line "L". The magnetic rolling drive mechanism 12 includes rolling drive coils 15 held by the holder 5 and rolling drive magnets 16 held by the fixed body 8. In this embodiment, the rolling drive coil 15 and the rolling drive magnet 16 face each other in the "Z"-axis direction (axial line "L" direction).

As shown in FIG. 1, the optical unit 1 includes flexible printed circuit boards 200, 300 and 400. In FIGS. 2 through 10, the flexible printed circuit boards 200, 300 and 400 are not shown. The flexible printed circuit board 200 (optical module printed circuit board) is connected with the camera module 101. The flexible printed circuit board 200 is provided with power feeding lines to the camera module 101 and signal lines for transmitting signals from the camera module 101 to an outer side. The flexible printed circuit board 300 (swing mechanism wiring board) is connected with the magnetic swing drive mechanism 11. The flexible printed circuit board 300 is provided with power feeding lines for supplying electrical power to the swing drive coils 13. The flexible printed circuit board 400 (rolling mechanism wiring board) is connected with the magnetic rolling drive mechanism 12. The flexible printed circuit board 400 is provided with power feeding lines for supplying electrical power to the rolling drive coils 15.

(Fixed Body)

As shown in FIGS. 1, 3 and 4, the fixed body 8 includes a fixed body main body 24 which is assembled and structured of three cases 28, 29 and 30, a plate spring 25 (spring member) fixed to the fixed body main body 24, and a movable holder 26 which is supported by the fixed body main body 24 through the plate spring 25. The movable holder 26 is supported in a movable state in the "Z"-axis direction. As shown in FIG. 1, the fixed body main body 24 includes a tube-shaped case 28 in a substantially octagonal outward shape when viewed in the "Z"-axis direction (axial line direction), an object side case 29 which is assembled to the tube-shaped case 28 from the "+Z" direction side (object side), and an anti-object side case 30 which is assembled to the tube-shaped case 28 from the "−Z" direction side (anti-object side). The tube-shaped case 28 is formed of magnetic material. The object side case 29 and the anti-object side case 30 are formed of resin material.

As shown in FIG. 3, the tube-shaped case 28 is provided with a tube-shaped body part 31 in a substantially octagonal shape and a frame-shaped end plate part 32 which is projected to an inner side from an end part in the "+Z" direction of the body part 31. A center of the end plate part 32 is formed with an opening part 33 in a substantially octagonal shape. The body part 31 is provided with side plates 35 and 36 facing each other in the "X"-axis direction, side plates 37 and 38 facing each other in the "Y"-axis direction, and side plates 39 provided in four corner parts which are inclined at 45 degrees with respect to the "X"-axis direction and the "Y"-axis direction. As shown in FIGS. 3 and 4, the swing drive magnet 14 is fixed to each of inner peripheral faces of the side plates 35 and 36 facing in the "X"-axis direction and each of inner peripheral faces of the side plates 37 and 38 facing in the "Y"-axis direction. Further, as shown in FIG. 4, each of two side plates 39 located on the "+X" direction side of the four side plates 39 is formed with a rectangular cut-out part 40. The cut-out part 40 is formed in the side plate 39 whose end edge in the "−Z" direction is cut out to the "+Z" direction.

The object side case 29 is provided with a tube-shaped body part 43 which is abutted with the end plate part 32 of the tube-shaped case 28 and an end plate part 44 which is projected to an inner side from an end part in the "+Z" direction of the body part 43. A circular opening part 45 is formed at a center of the end plate part 44. As shown in FIG. 4, an inner peripheral face of the body part 43 is formed in a substantially circular shape and its outer peripheral face when viewed in the "Z"-axis direction is formed in a substantially octagonal shape. The outer peripheral face of the body part 43 is provided with side faces 47 and 48 facing each other in the "X"-axis direction, side faces 49 and 50 facing each other in the "Y"-axis direction, and side faces 51 provided in four corner parts which are inclined at 45 degrees with respect to the "X"-axis direction and the "Y"-axis direction. The object side case 29 is fixed to the tube-shaped case 28 by four headed screws 52 which are penetrated through the end plate part 32 of the tube-shaped case 28 from the "−Z" direction side and screwed into the body part 43. In this embodiment, a face in the "−Z" direction of the end plate part 44 is a ring-shaped face which is coaxial with the axial line "L" and is a fixed body side facing part 55 which faces the holder 5 in the "Z"-axis direction. The fixed body side facing part 55 is provided with a fixed body side ring-shaped groove 56. The fixed body side ring-shaped groove 56 is coaxial with the axial line "L" and its cross-sectional shape is a circular arc shape.

The anti-object side case 30 is, as shown in FIG. 3, provided with an end plate part 58 in a substantially octagonal shape which is perpendicular to the axial line "L", a wall part 59 which is stood up to the "+Z" direction from an end edge (side) in the "−X" direction of the end plate part 58, two wall parts 60 which are stood up to the "+Z" direction from end edges (sides) in the "−Y" direction and the "+Y" direction of the end plate part 58 so as to face each other in the "Y"-axis direction, and two wall parts 61 which are located between the wall part 59 and two respective wall parts 60 and are inclined at 45 degrees with respect to the "X"-axis direction and the "Y"-axis direction. In this embodiment, no wall part is provided in an end edge (side) in the "+X" direction of the end plate part 58 and an opening part 62 is formed between ends in the "+X" direction of the two wall parts 60 facing in the "Y"-axis direction. As shown in FIG. 1, the opening part 62 is an extending-out port for the flexible printed circuit boards 200, 300 and 400.

End portions in the "+Z" direction of the two wall parts 60 facing in the "Y"-axis direction are provided with plate spring fixing parts 65 to which both end portions in the "Y" direction of the plate spring 25 are fixed. The plate spring fixing part 65 is provided with an end face 65a which is enlarged in the "X"-axis direction and the "Y"-axis direction at a position on the "−Z" direction side with respect to a tip end of the wall part 59, a rectangular protruded part 65b which is formed in an edge portion on an outer peripheral side of the end face 65a, and a circular projection 65c which is protruded from a center of the rectangular protruded part 65b to the "+Z" direction.

Figure 5:
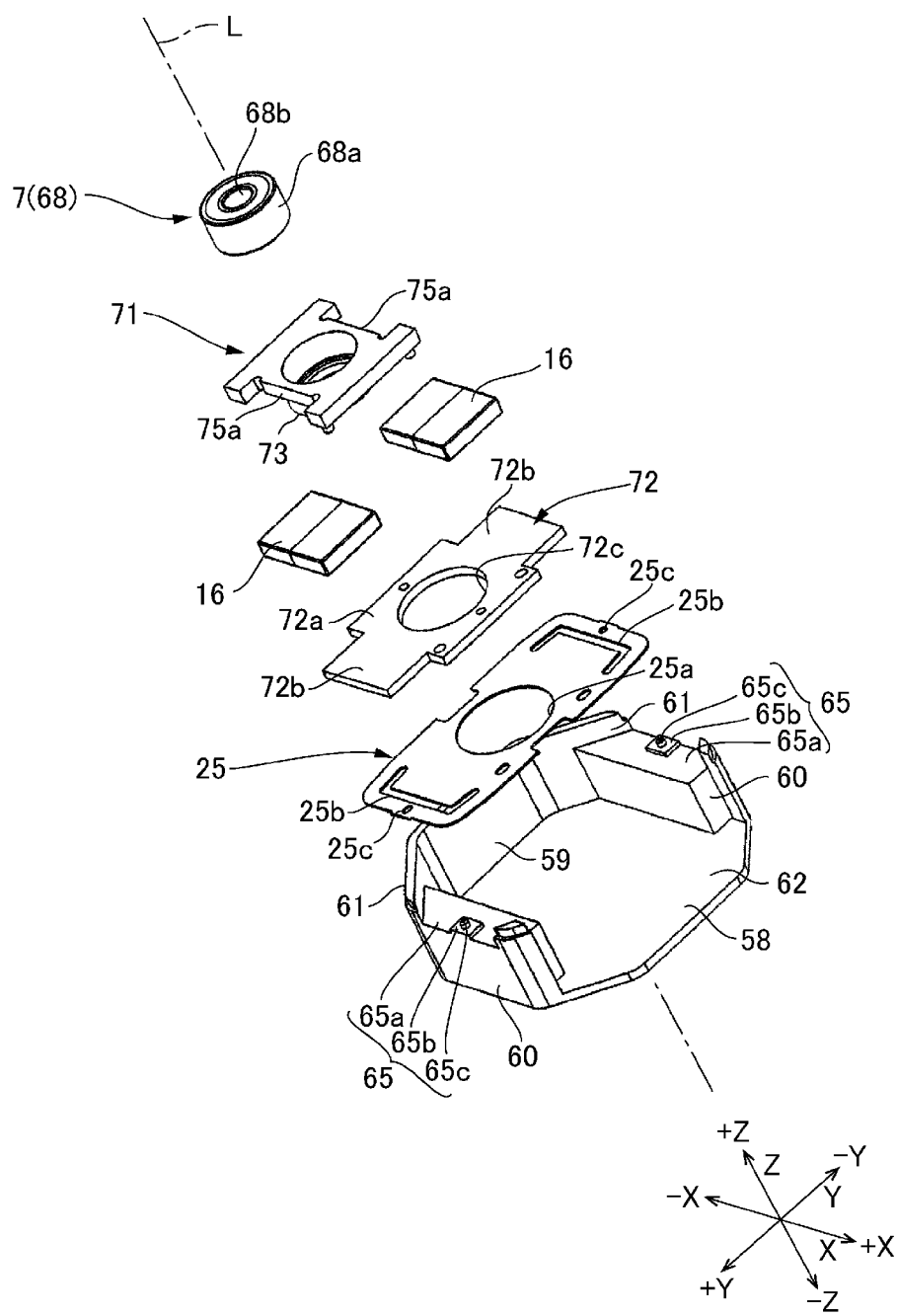
FIG. 5 is an exploded perspective view showing an anti-object side portion of a fixed body.

FIG. 5 is an exploded perspective view showing an anti-object side portion of the fixed body 8 (second turnable support mechanism 7, movable holder 26, plate spring 25 and anti-object side case 30). As shown in FIG. 5, the movable holder 26 includes an outer ring 68a of a ball bearing 68 structuring the second turnable support mechanism 7 and a movable holder main body member 71 which holds two rolling drive magnets 16. The movable holder main body member 71 is provided with a tube part 73 to which the outer ring 68a is fitted. The two rolling drive magnets 16 are fitted from outer peripheral sides to recessed parts 75a formed on both sides in the "Y"-axis direction of the movable holder main body member 71 and are held by the movable holder main body member 71. Further, the movable holder 26 includes a yoke 72 which is abutted with the movable holder main body member 71 from the "−Z" direction. A portion of the yoke 72 with which the rolling drive magnet 16 is abutted is applied with an adhesive and the rolling drive magnets 16 are also fixed to the yoke 72.

The plate spring 25 is provided with a substantially rectangular outline shape which is long in the "Y"-axis direction. The plate spring 25 is provided at its center in the "Y"-axis direction with a through hole 25a into which the tube part 73 of the movable holder main body member 71 is capable of being inserted. Further, the pate spring 25 is provided with a U-shaped slit 25b on both sides in the "Y"-axis direction with the through hole 25a interposed therebetween. Shapes of the two slits 25b are formed so as to be located and border end portions in the "Y"-axis direction of the yoke 72 when the yoke 72 and the plate spring 25 are overlapped with each other. Further, the plate spring 25 is provided with a fixed hole 25c for fixing the plate spring 25 to the plate spring fixing part 65 on both end portions in the "Y"-axis direction (outer sides in the "Y"-axis direction with respect to two slits 25b).

The plate spring 25 is supported by the plate spring fixing part 65 in a state that the projections 65c are inserted into the fixed holes 25c and center portions of both end portions in the "Y"-axis direction are placed on the protruded parts 65b. Further, as shown in FIG. 1, when the tube-shaped case 28 and the anti-object side case 30 are assembled, the plate spring 25 is sandwiched between the tube-shaped case 28 and the anti-object side case 30 and thereby the plate spring 25 is fixed to the fixed body 8. In this embodiment, as shown in FIG. 2, when the movable holder 26 is supported by the fixed body 8, the plate spring 25 is set in a state that an urging force "F" is applied to the movable holder 26 in the "+Z" axial direction (object side). In other words, the plate spring 25 is set in a state that its portion on an inner peripheral side with respect to both end portions in the "Y"-axis direction fixed to the plate spring fixing part 65 is resiliently bent to the "−Z" direction (anti-object side) and, as a result, the movable holder 26 is urged to the "+Z" axial direction by the elastic return force.

(Holder)

Figure 6:
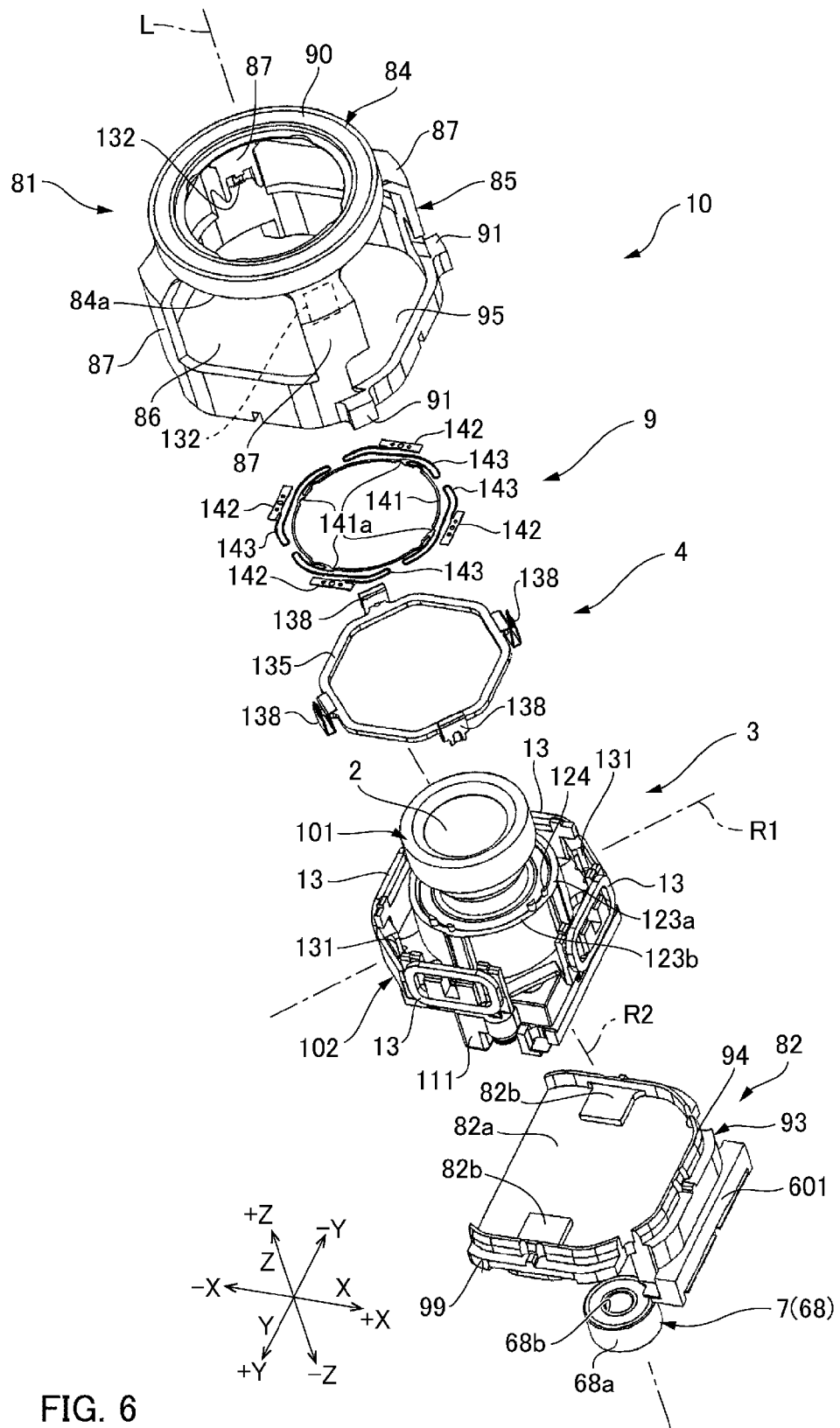
FIG. 6 is an exploded perspective view showing a movable body structured of a swing body and a holder which is viewed from an object side.
Figure 7:
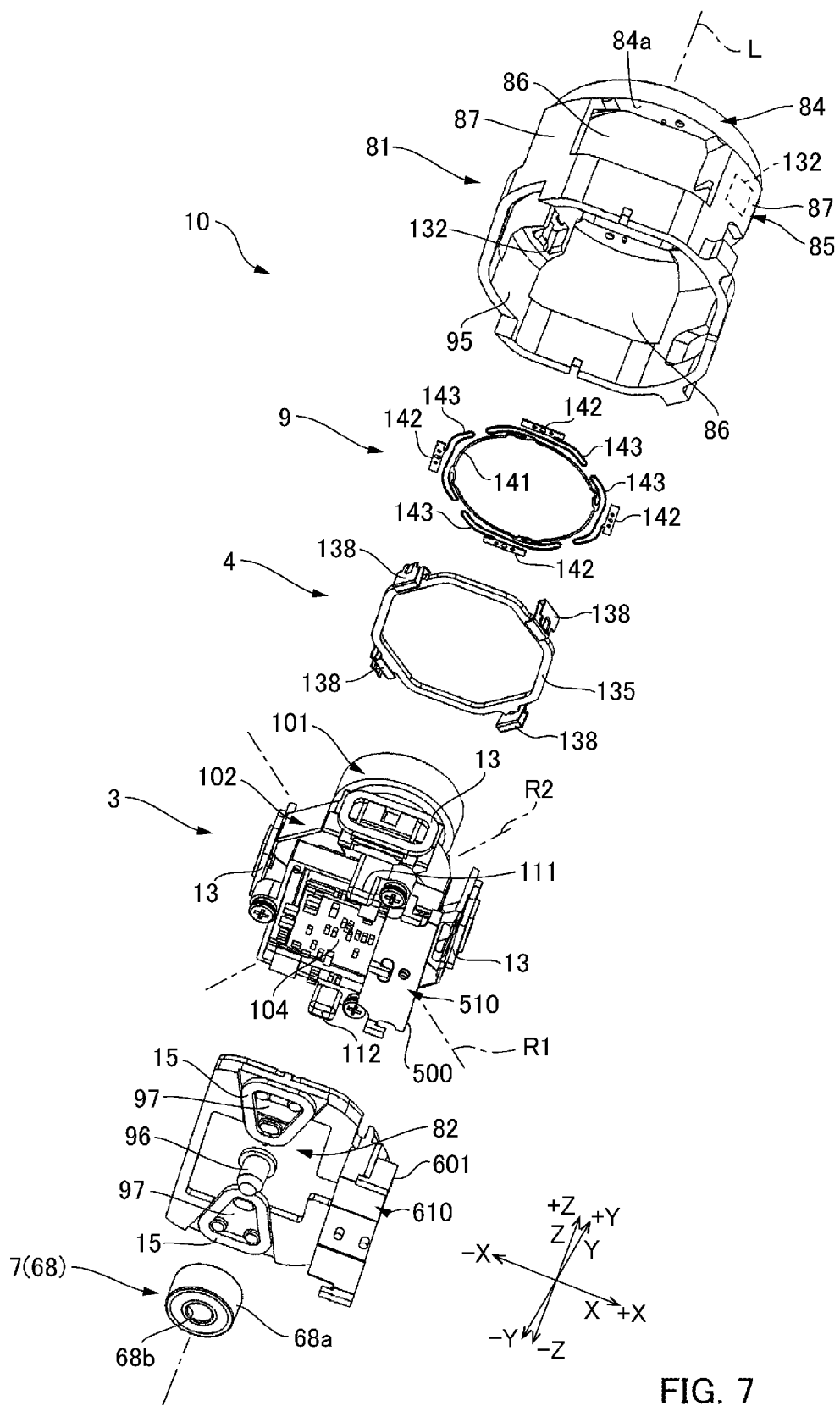
FIG. 7 is an exploded perspective view showing a movable body structured of a swing body and a holder which is viewed from an anti-object side.

FIG. 6 is an exploded perspective view showing the movable body 10 structured of the swing body 3 and the holder 5 which is viewed from the "+Z" direction side. FIG. 7 is an exploded perspective view showing the movable body 10 structured of the swing body 3 and the holder 5 which is viewed from the "−Z" direction side. As shown in FIG. 6, the holder 5 includes a holder main body member 81 located on an outer peripheral side with respect to the swing body 3 and a holder bottom plate member 82 which is fixed to the holder main body member 81 from the "−Z" direction side so as to face the swing body 3. The holder main body member 81 and the holder bottom plate member 82 are made of resin.

As shown in FIG. 6, the holder main body member 81 includes a holder side facing part 84 (support body side facing part) in a ring shape which faces the fixed body side facing part 55 in a ring shape of the fixed body 8 (object side case 29) at an end in the "+Z" direction, and a holder body part 85 which is continuously formed from the "−Z" direction side of the holder side facing part 84. The holder body part 85 is provided with four window parts 86 arranged in a circumferential direction and four vertical frame parts 87 which section the adjacent window parts 86 in the circumferential direction. Two of the four window parts 86 are opened in the "X"-axis direction and the other two window parts 86 are opened in the "Y"-axis direction. The four vertical frame parts 87 are respectively disposed at angular positions between the "X"-axis direction and the "Y"-axis direction.

An end face on the "+Z" direction side of the holder side facing part 84 is a ring-shaped face which is perpendicular to the axial line "L", and the ring-shaped face is provided with a holder side ring-shaped groove 90 (support body side ring-shaped groove). The holder side ring-shaped groove 90 faces the fixed body side ring-shaped groove 56 provided in the holder side facing part 84 in the "Z"-axis direction. The holder side ring-shaped groove 90 is coaxial with the axial line "L" and its cross-sectional shape is a circular arc shape. The holder side facing part 84 is provided with a ring-shaped end face 84a which faces in the "−Z" direction and is perpendicular to the axial line "L".

An end portion in the "−Z" direction of the holder body part 85 is provided with a projection 91 which is protruded to an intermediate direction between the "+X" direction and the "+Y" direction, and a projection 91 which is protruded to an intermediate direction between the "+X" direction and the "−Y" direction. The projections 91 are disposed in the cut-out parts 40 formed in the side plate 39 of the tube-shaped case 28 (fixed body 8). The holder 5 is capable of being turned around the axial line "L" in a region that the projection 91 is capable of moving in the cut-out part 40 in a circumferential direction. In other words, the projection 91 and the cut-out part 40 structure a stopper mechanism 19 (see FIG. 1) which restricts a turnable range of the movable body 10 around the axial line "L" with respect to the fixed body 8.

The holder bottom plate member 82 is provided with an opposed face 82a which is perpendicular to the axial line "L" and faces the swing body 3 from the "−Z" direction side. Both end portions in the "Y"-axis direction of the opposed face 82a are provided with rectangular protruded portions 82b protruding to the "+Z" direction. An outer peripheral edge of the opposed face 82a of the holder bottom plate member 82 is provided with a step part 93 which surrounds its bottom plate from both sides in the "Y"-axis direction and from the "+X" direction side. The step part 93 is provided with a ring-shaped protruded part 94 which protrudes to the "+Z" direction on its inner peripheral side. When the holder bottom plate member 82 is fixed to the holder main body member 81, the ring-shaped protruded part 94 is fitted to an inner side in an opening part 95 on the "−Z" direction side of the holder main body member 81 (holder body part 85).

The holder bottom plate member 82 is, as shown in FIG. 7, provided with a shaft part 96 which is protruded to the "−Z" direction. The shaft part 96 is coaxially provided with the axial line "L". The shaft part 96 holds an inner ring 68b of the ball bearing 68 on its outer peripheral side. An end face in the "+Z" direction of the inner ring 68b is abutted with the holder bottom plate member 82. Further, the holder bottom plate member 82 is provided with rolling drive coil holding parts 97 on both sides in the "Y"-axis direction with the shaft part 96 interposed therebetween. The rolling drive coil 15 is held by the rolling drive coil holding part 97 from the "−Z" direction side.

(Swing Body)

Figure 8:
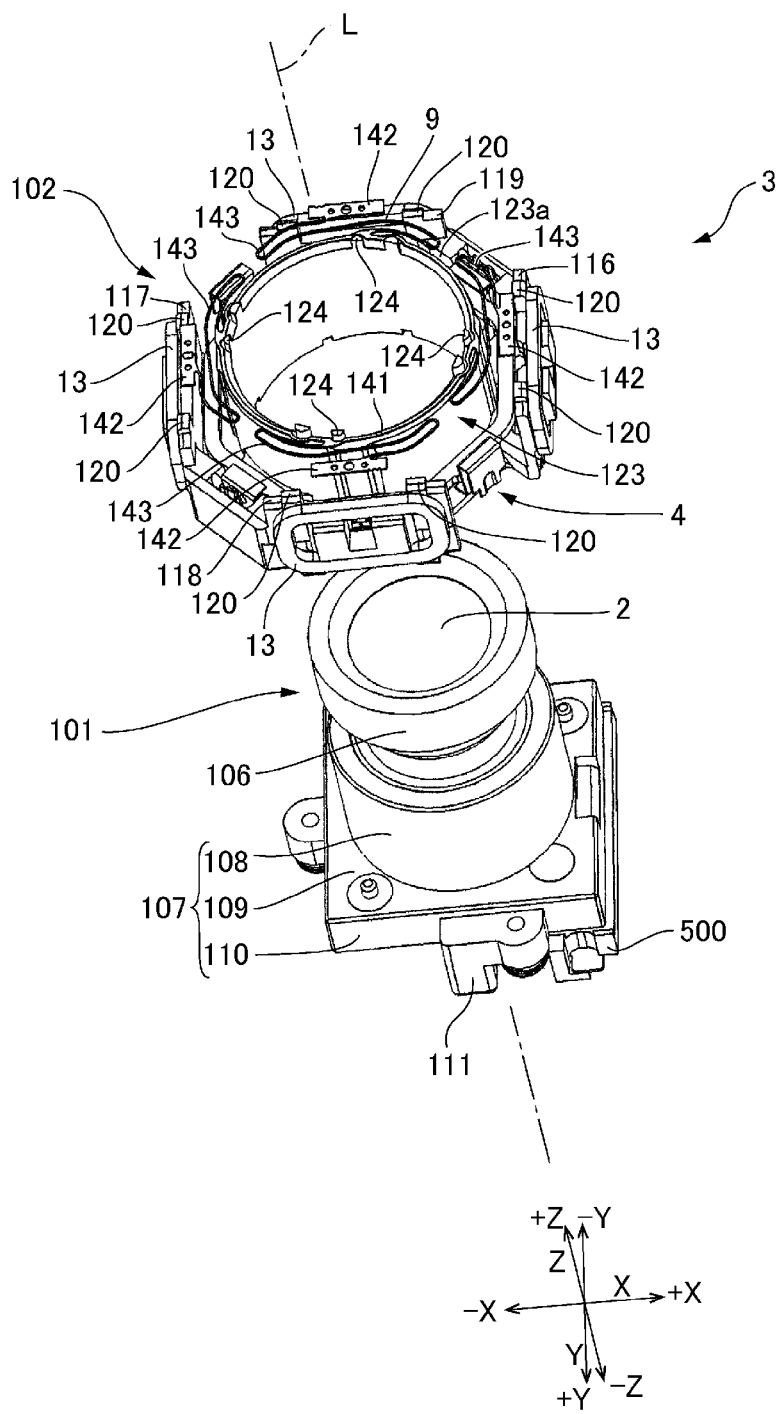
FIG. 8 is an exploded perspective view showing a movable body which is viewed from an object side.
Figure 9:
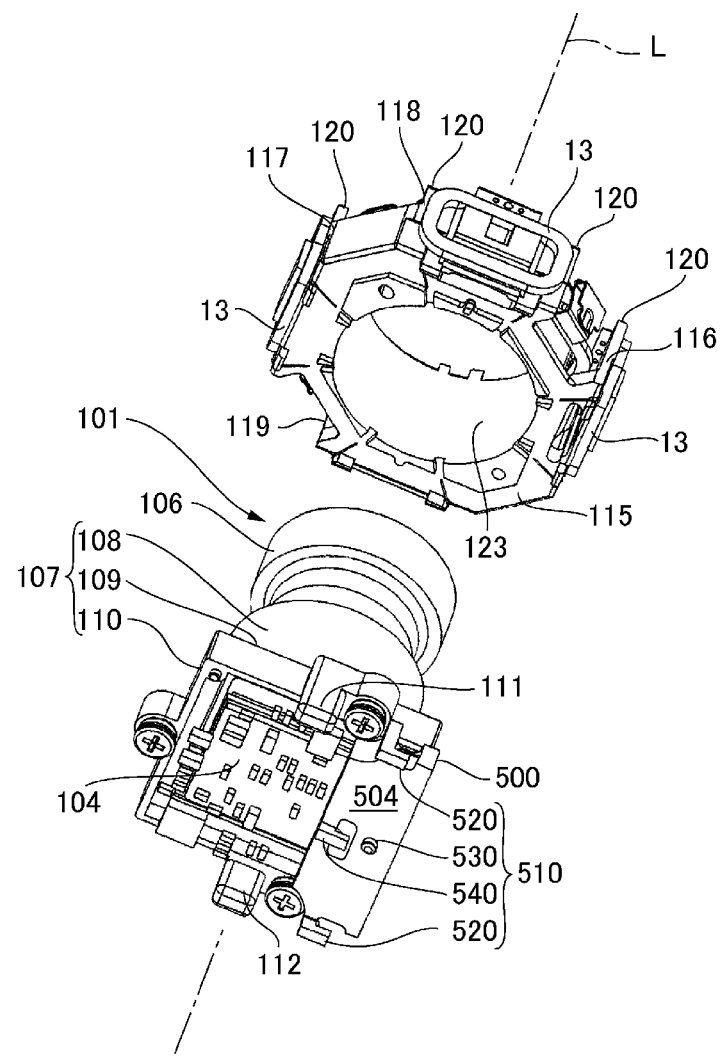
FIG. 9 is an exploded perspective view showing a movable body which is viewed from an anti-object side.

FIG. 8 is an exploded perspective view showing the swing body 3, the swing support mechanism 4 and the plate spring 9 which are viewed from the "+Z" direction side (object side). FIG. 9 is an exploded perspective view showing the swing body 3, the swing support mechanism 4 and the plate spring 9 which are viewed from the "−Z" direction side (anti-object side). As shown in FIGS. 8 and 9, the swing body 3 includes the camera module 101 (optical module) and a camera module holder 102 which holds the camera module 101 from an outer peripheral side. The camera module 101 includes, as shown in FIG. 2, the optical element 2 and an imaging element 103 located on an optical axis of the optical element 2. The imaging element 103 is mounted on a circuit board 104 (module circuit board) on which a gyroscope, a signal processing circuit and the like are mounted. The flexible printed circuit board 200 (see FIG. 1) is connected with the circuit board 104.

The camera module 101 includes a lens barrel member 106 which holds the optical element 2 and a frame 107 which holds the lens barrel member 106 and the circuit board 104. The frame 107 is provided with a cylindrical tube part 108, which holds an end portion in the "−Z" direction of the lens barrel member 106 on its inner peripheral side, a rectangular plate part 109 which is enlarged from an end edge in the "−Z" direction of the cylindrical tube part 108 to an outer peripheral side, and a rectangular tube part 110 which is extended to the "−Z" direction from an outer peripheral edge of the plate part 109. As shown in FIG. 9, the circuit board 104 is held on an inner peripheral side of the rectangular tube part 110. Further, the frame 107 is provided with first stopper protruded parts 111 and 112 protruded in the "−Z" direction on both sides in the "Y"-axis direction with the optical axis (axial line "L"), the imaging element 103 and the circuit board 104 (module circuit board) interposed therebetween. Flexible printed circuit boards 200 and 300 (see FIG. 1) are extended around between the first stopper protruded part 111 and the first stopper protruded part 112. The first stopper protruded parts 111 and 112 and the rectangular protruded portions 82b provided on the opposed face 82a of the holder bottom plate member 82 are faced each other in the "Z"-axis direction and structure a stopper mechanism 17 (see FIG. 2) which restricts a swing range of the swing body 3.

As shown in FIG. 9, the camera module holder 102 is provided with a bottom plate part 115 formed in a substantially octagonal shape when viewed in the "Z"-axis direction, a pair of wall parts 116 and 117 which are stood up to the "+Z" direction and extended in the "Y"-axis direction on both ends in the "X"-axis direction of the bottom plate part 115, and a pair of wall parts 118 and 119 which are stood up to the "+Z" direction and extended in the "X"-axis direction on both ends in the "Y"-axis direction of the bottom plate part 115. A swing drive coil 13 is fixed to each of the wall parts 116, 117, 118 and 119.

An end face in the "+Z" direction of each of the wall parts 116, 117, 118 and 119 is provided with two second stopper protruded parts 120 which are protruded to the "+Z" direction. The two second stopper protruded parts 120 are respectively protruded from both end portions in a circumferential direction of each of the wall parts 116, 117, 118 and 119. The second stopper protruded parts 120 and the ring-shaped end face 84a in the "−Z" direction of the holder side facing part 84 are faced each other in the "Z"-axis direction and structure a stopper mechanism 18 (see FIG. 2) which restricts a swing range of the swing body 3.

The camera module holder 102 is provided with a tube shape holding part 123 which is stood up to the "+Z" direction from an edge of a circular through-hole formed at a center of the bottom plate part 115. A ring-shaped end face 123a in the "+Z" direction of the holding part 123 is provided with a plate spring fixing protruded part 124 for fixing the plate spring 9 at four positions at equal angular intervals. The plate spring 9 is fixed to the ring-shaped end face 123a through an adhesive layer. Therefore, in a state that the movable body side connection part 141 is fixed to the ring-shaped end face 123a, the plate spring 9 is floated from the ring-shaped end face 123a to the "+Z" direction.

(Plate Spring)

As shown in FIGS. 6 and 7, the plate spring 9 is a rectangular frame-shaped plate spring which is structured by processing a metal plate. The plate spring 9 is disposed between the ring-shaped end face 123a (end face in the "+Z" direction) of the holding part 123 of the camera module holder 102 and the ring-shaped end face 84a facing the "−Z" direction of the holder side facing part 84 of the holder main body member 81. The plate spring 9 is provided with a movable body side connection part 141 in a ring shape which is fixed to the ring-shaped end face 123a, four holder side connecting parts 142 which are fixed to the ring-shaped end face 84a, and meandering parts 143 which are located in the radial direction between the movable body side connection part 141 and the respective holder side connecting parts 142. The movable body side connection part 141 is provided with four connected portions 141a which are fixed to four plate spring fixing protruded parts 124 provided on the ring-shaped end face 123a from an outer peripheral side through an adhesive layer. The plate spring 9 determines a reference posture of the swing body 3. In other words, a posture of the swing body 3 (camera module 101) in a stationary state that the magnetic swing drive mechanism 11 is not driven is determined by the plate spring 9.

(Swing Support Mechanism)

Figure 10:
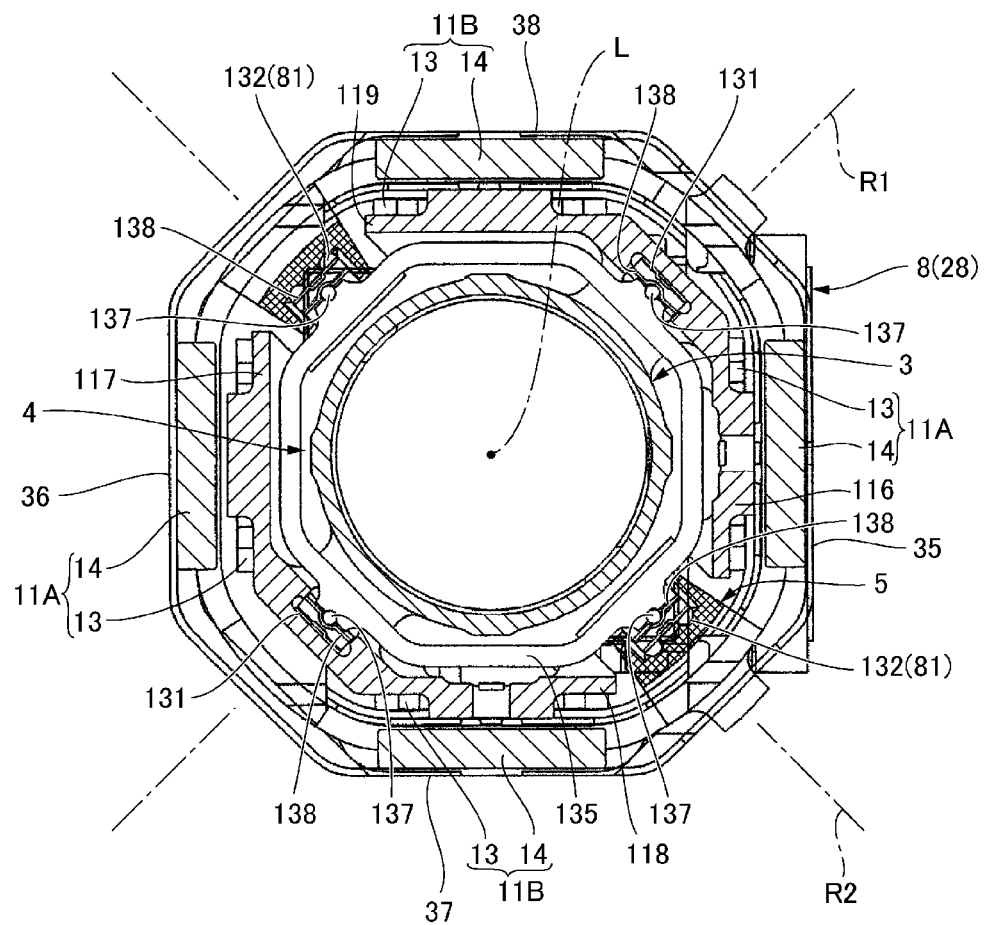
FIG. 10 is a cross-sectional view showing an optical unit which is cut by a plane perpendicular to an axial line.

FIG. 10 is a cross-sectional view showing the optical unit 1 which is cut by a plane which is perpendicular to the axial line "L" and passes the swing support mechanism 4. The swing support mechanism 4 is a gimbal mechanism which is structured between the camera module holder 102 and the holder main body member 81. As shown in FIGS. 6 and 7, the swing support mechanism 4 includes two first swing support parts 131 which are provided at diagonal positions on a first axial line "R1" of the camera module holder 102, two second swing support parts 132 which are provided at diagonal positions on a second axial line "R2" of the holder main body member 81, and a movable frame 135 which is supported by the first swing support parts 131 and the second swing support parts 132. The first axial line "R1" and the second axial line "R2" are perpendicular to the "Z"-axis direction and are inclined by 45 degrees with respect to the "X"-axis direction and the "Y"-axis direction. Therefore, the first swing support part 131 and the second swing support part 132 are disposed at angular positions between the "X"-axis direction and the "Y"-axis direction. As shown in FIGS. 6 and 7, the second swing support part 132 is a recessed part which is formed on an inner side face of the holder main body member 81.

As shown in FIG. 10, the movable frame 135 is a plate-shaped spring whose planar shape viewed in the "Z"-axis direction is a substantially octagonal shape. A metal spherical body 137 is fixed to an outer side face of the movable frame 135 at four positions around the axial line "L" by welding or the like. The spherical bodies 137 are in point contact with point contact springs 138 which are held by the first swing support parts 131 provided in the camera module holder 102, and are in point contact with point contact springs 138 which are held by the second swing support parts 132 provided in the holder main body member 81. The point contact spring 138 is a plate-shaped spring. The point contact spring 138 which is held by the first swing support part 131 is capable of being elastically deformed in the first axial line "R1" direction, and the point contact spring 138 which is held by the second swing support part 132 is capable of being elastically deformed in the second axial line "R2" direction. Therefore, the movable frame 135 is supported in a turnable state around two directions (first axial line "R1" direction and second axial line "R2" direction) perpendicular to the "Z"-axis direction.

(First Turnable Support Mechanism and Second Turnable Support Mechanism)

Next, the first turnable support mechanism 6 and the second turnable support mechanism 7 which turnably support the holder 5 around the axial line "L" will be described below. As shown in FIGS. 2, 3 and 4, the first turnable support mechanism 6 includes a plurality of spherical bodies 151 (rolling body) and a retainer 152 which holds the spherical bodies 151 between the fixed body side facing part 55 and the holder side facing part 84. As shown in FIGS. 3 and 4, the retainer 152 is provided with a plurality of through holes 153 arranged at an equal interval in a circumferential direction. Each of the plurality of the spherical bodies 151 is inserted into the fixed body side ring-shaped groove 56 and the holder side ring-shaped groove 90 in a state that the spherical body 151 is disposed on an inner side of each of the plurality of the through holes 153. Lubricating oil is applied to surfaces of the fixed body side ring-shaped groove 56 and the holder side ring-shaped groove 90. In this embodiment, the numbers of the spherical bodies 151 and the through holes 153 are six (6). The spherical body 151 rolls on the fixed body side ring-shaped groove 56 and the holder side ring-shaped groove 90 in a state that the spherical body 151 is located on an inner side of the through hole 153.

The retainer 152 is provided with first protruded parts 154 (see FIG. 3) which are protruded toward the fixed body side facing part 55 and second protruded parts 155 (see FIG. 4) which are protruded toward the holder side facing part 84 between two through holes 153 adjacent to each other in a circumferential direction. A center portion in the circumferential direction of the first protruded part 154 is capable of slidably contacting with an edge portion on an inner peripheral side and an edge portion on an outer peripheral side of the fixed body side ring-shaped groove 56 in the fixed body side facing part 55. Further, a center portion in the circumferential direction of the second protruded part 155 is capable of slidably contacting with an edge portion on an inner peripheral side and an edge portion on an outer peripheral side of the holder side ring-shaped groove 90 in the holder side facing part 84.

As shown in FIG. 2, a ring-shaped protruded part 157 which is protruded toward the "−Z" direction is provided in an end portion on an inner peripheral side with respect to the fixed body side ring-shaped groove 56 of the fixed body side facing part 55. On the other hand, a ring-shaped step part 158 which is recessed to the "−Z" direction so as to accommodate a tip end portion of the ring-shaped protruded part 157 is provided in an end portion on an inner peripheral side with respect to the holder side ring-shaped groove 90 of the holder side facing part 84. A space between the ring-shaped protruded part 157 and the ring-shaped step part 158 structures a labyrinth seal. The labyrinth seal prevents or suppresses dust and dirt from entering between the fixed body side facing part 55 and the holder side facing part 84 where the spherical bodies 151 are rolled.

The ball bearing 68 of the second turnable support mechanism 7 includes, as shown in FIG. 2, an inner ring 68*b* which is held on an outer peripheral side of the shaft part 96 of the holder 5 (holder bottom plate member 82), an outer ring 68*a* which is located on an outer peripheral side with respect to the inner ring 68*b*, and a plurality of spherical bodies 68*c* rolling between the inner ring 68*b* and the outer ring 68*a* in a radial direction. The outer ring 68*a* is held by the movable holder 26.

The plate spring 25 applies pressurization (urging force "F") toward the "+Z" direction to the ball bearing 68. In other words, the plate spring 25 urges the movable holder 26 toward the holder side facing part 84 and thereby the outer ring 68*a* held by the holder 5 is urged to the holder side facing part 84. As a result, a relative position in the "Z"-axis direction of the inner ring 68*b* and the outer ring 68*a* is positioned with the holder side facing part 84 as a reference. Further, a state that the outer ring 68*a* is abutted with the holder side facing part 84 is maintained by the pressurization (urging force "F" of the plate spring 25). In this manner, turning of the holder 5 which is supported by the second turnable support mechanism 7 is stabilized.

In addition, the plate spring 25 urges the holder 5 toward the fixed body side facing part 55 of the fixed body 8 (object side case 29) through the movable holder 26 and the outer ring 68*a*. In this manner, the plate spring 25 applies pressurization (urging force "F" in FIG. 2) to the first turnable support mechanism 6 toward the "+Z" direction. In other words, the plate spring 25 urges the holder side facing part 84 toward the fixed body side facing part 55 in the "Z"-axis direction. As a result, the holder side facing part 84 and the fixed body side facing part 55 are not separated from each other in the "Z"-axis direction. Therefore, the spherical bodies 151 held by the retainer 152 do not come off from a space between the holder side ring-shaped groove 90 of the holder side facing part 84 and the fixed body side ring-shaped groove 56 of the fixed body side facing part 55 and thus the holder 5 is smoothly turned with respect to the fixed body 8.

In accordance with at least an embodiment of the present invention, one or both of the first turnable support mechanism 6 and the second turnable support mechanism 7 may be a slide bearing other than a ball bearing.

(Magnetic Swing Drive Mechanism)

The magnetic swing drive mechanism 11 includes, as shown in FIG. 10, a first magnetic swing drive mechanism 11A and a second magnetic swing drive mechanism 11B structured between the swing body 3 and the fixed body 8. The first magnetic swing drive mechanism 11A includes two pairs of swing drive magnets 14 and swing drive coils 13 which face each other in the "X"-axis direction. The second magnetic swing drive mechanism 11B includes two pairs of swing drive magnets 14 and swing drive coils 13 which face each other in the "Y"-axis direction. The swing drive coil 13 is held by outer side faces of the wall parts 116 and 117 on both sides in the "X"-axis direction of the camera module holder 102 and by outer side faces of the wall parts 118 and 119 on both sides in the "Y"-axis direction of the camera module holder 102. The swing drive magnet 14 is held by inner side faces of side plates 35, 36, 37 and 38 which are provided in the tube-shaped case 28 of the fixed body 8. Each of the swing drive magnets 14 is, as shown in FIGS. 3 and 4, divided into two pieces in the "Z"-axis direction, and magnetic poles on its inner face side are magnetized to be different from each other with a divided position (magnetizing polarized line) as a boundary. The swing drive coil 13 is an air-core coil and its long side portions on the "+Z" direction side and the "−Z" direction side are utilized as effective sides. In this embodiment, the tube-shaped case 28 is structured of magnetic material and thus it functions as a yoke for the swing drive magnets 14.

The two pairs of the second magnetic swing drive mechanisms 11B located on the "+Y" direction side and the "−Y" direction side of the swing body 3 are electrically connected so as to generate magnetic-drive forces of the same direction around the "X"-axis when power is supplied to the swing drive coils 13. Further, the two pairs of the first magnetic swing drive mechanisms 11A located on the "+X" direction side and the "−X" direction side of the swing body 3 are electrically connected so as to generate magnetic-drive forces of the same direction around the "Y"-axis when power is supplied to the swing drive coils 13. The magnetic swing drive mechanism 11 turns the swing body 3 around the first axial line "R1" and around the second axial line "R2" by combining turning around the "X"-axis by the second magnetic swing drive mechanism 11B with turning around the "Y"-axis by the first magnetic swing drive mechanism 11A. When a shake correction around the "X"-axis and a shake correction around the "Y"-axis are to be performed, turning around the first axial line "R1" and turning around the second axial line "R2" are combined with each other.

(Magnetic Rolling Drive Mechanism)

The magnetic rolling drive mechanism 12 includes, as shown in FIG. 2, two rolling drive coils 15 which are held by the rolling drive coil holding parts 97 provided in the holder bottom plate member 82 on both sides in the "Y"-axis direction with the shaft part 96 interposed therebetween, and two rolling drive magnets 16 which are held by the movable holder 26 of the fixed body 8 so as to face the respective rolling drive coils 15 in the "Z"-axis direction. Each of the rolling drive magnets 16 is, as shown in FIGS. 3 and 5, divided in two pieces in a circumferential direction, and magnetic poles facing the rolling drive coil 15 are magnetized to be different from each other with a divided position (magnetizing polarized line) as a boundary. The rolling drive coil 15 is an air-core coil and its long side portions extended in the radial direction are utilized as effective sides.

(Shake Correction of Optical Unit)

The optical unit 1 includes, as described above, the magnetic swing drive mechanism 11 structured to perform a shake correction around the "X"-axis and a shake correction around the "Y"-axis. Therefore, shake corrections in the pitching (vertical swing) direction and the yawing (lateral swing) direction can be performed. Further, the optical unit 1 includes the magnetic rolling drive mechanism 12 and thus a shake correction in the rolling direction can be performed. In this embodiment, the optical unit 1 includes a gyroscope in the swing body 3 and thus, shakes around three axes perpendicular to each other are detected by the gyroscope and the magnetic swing drive mechanism 11 and the magnetic rolling drive mechanism 12 are driven so as to cancel the shake which is detected.

(Fixing Structure of Flexible Printed Circuit Board)

Figure 11:
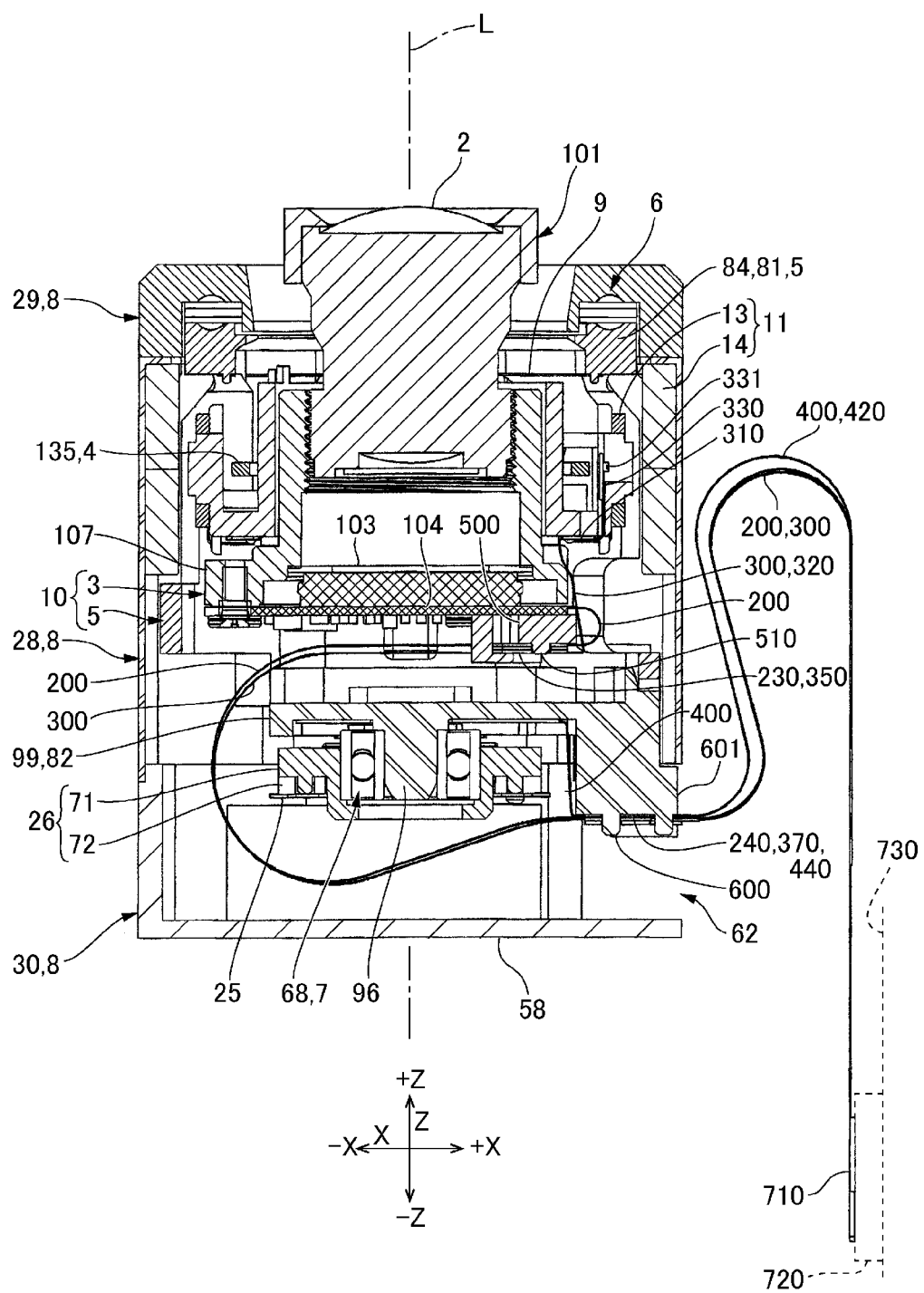
FIG. 11 is a cross-sectional view showing the optical unit which is cut by the "B-B" line in FIG. 1.

FIG. 11 is a cross-sectional view showing the optical unit 1 which is cut by the "B-B" line in FIG. 1. As shown in FIG. 11, the flexible printed circuit board 200 (optical module printed circuit board) connected with the camera module 101 is extended from one end of the circuit board 104 (end part in the "+X" direction) and bent in a "U"-shape so as to be turned around in parallel with the circuit board 104 on the "−Z" direction side with respect to the circuit board 104. Further, the flexible printed circuit board 300 (drive mechanism printed circuit board) connected with the swing drive coils 13 is extended from one end (end part in the "+X" direction) of the bottom plate part 115 of the camera module holder 102 toward an end part in the "+X" direction of the circuit board 104 and bent to the "−X" direction, and the flexible printed circuit board 300 is extended around together with the flexible printed circuit board 200 through a space between the circuit board 104 and the holder bottom plate member 82 in parallel with the circuit board 104.

In the circuit board 104, the imaging element 103 is mounted on its face on the optical element 2 side (face directing to the "+Z" direction) and electronic components are mounted on its opposite side face (face directing to the "−Z" direction) to the optical element 2. The face directing to the "−Z" direction of the circuit board 104 is provided with a flat face part where the electronic components are not mounted in an end part in the "+X" direction, and a spacer 500 is fixed to the flat face part. The spacer 500 is formed with a first movable body side fixing part 510 (fixing part) to which the flexible printed circuit boards 200 and 300 are fixed. The flexible printed circuit board 200 is turned around in a "U"-shape immediately after extended from the circuit board 104 and extended to a position along the first movable body side fixing part 510 and fixed to the first movable body side fixing part 510. Further, the flexible printed circuit board 300 is fixed to the first movable body side fixing part 510 in an overlapped state with the flexible printed circuit board 200. In other words, the flexible printed circuit boards 200 and 300 are collectively fixed to the first movable body side fixing part 510.

The flexible printed circuit boards 200 and 300 extended to the "−X" direction from the first movable body side fixing part 510 are turned around in a "U"-shape again at a position passing an end edge in the "−X" direction of the holder bottom plate member 82. Then, the flexible printed circuit boards 200 and 300 are extended toward the "+X" direction side passing through a space between the movable holder 26 and the plate spring 25 disposed on the "−Z" direction side of the holder bottom plate member 82 and the anti-object side case 30. Then, the flexible printed circuit boards 200 and 300 are fixed to a second movable body side fixing part 600 which is formed at an end part on the "+X" direction side of the holder bottom plate member 82. The second movable body side fixing part 600 is, in addition to the flexible printed circuit boards 200 and 300, fixed with also the flexible printed circuit board 400 (drive mechanism printed circuit board) which is connected with the rolling drive coils 15. In other words, the flexible printed circuit boards 200, 300 and 400 are collectively fixed to the second movable body side fixing part 600. The second movable body side fixing part 600 is provided in the vicinity of the opening part 62 of the anti-object side case 30. Therefore, the flexible printed circuit boards 200, 300 and 400 are extended out from the opening part 62 to the outside of the fixed body 8 immediately after fixed to the second movable body side fixing part 600.

(Structure of Flexible Printed Circuit Board)

Figure 12:
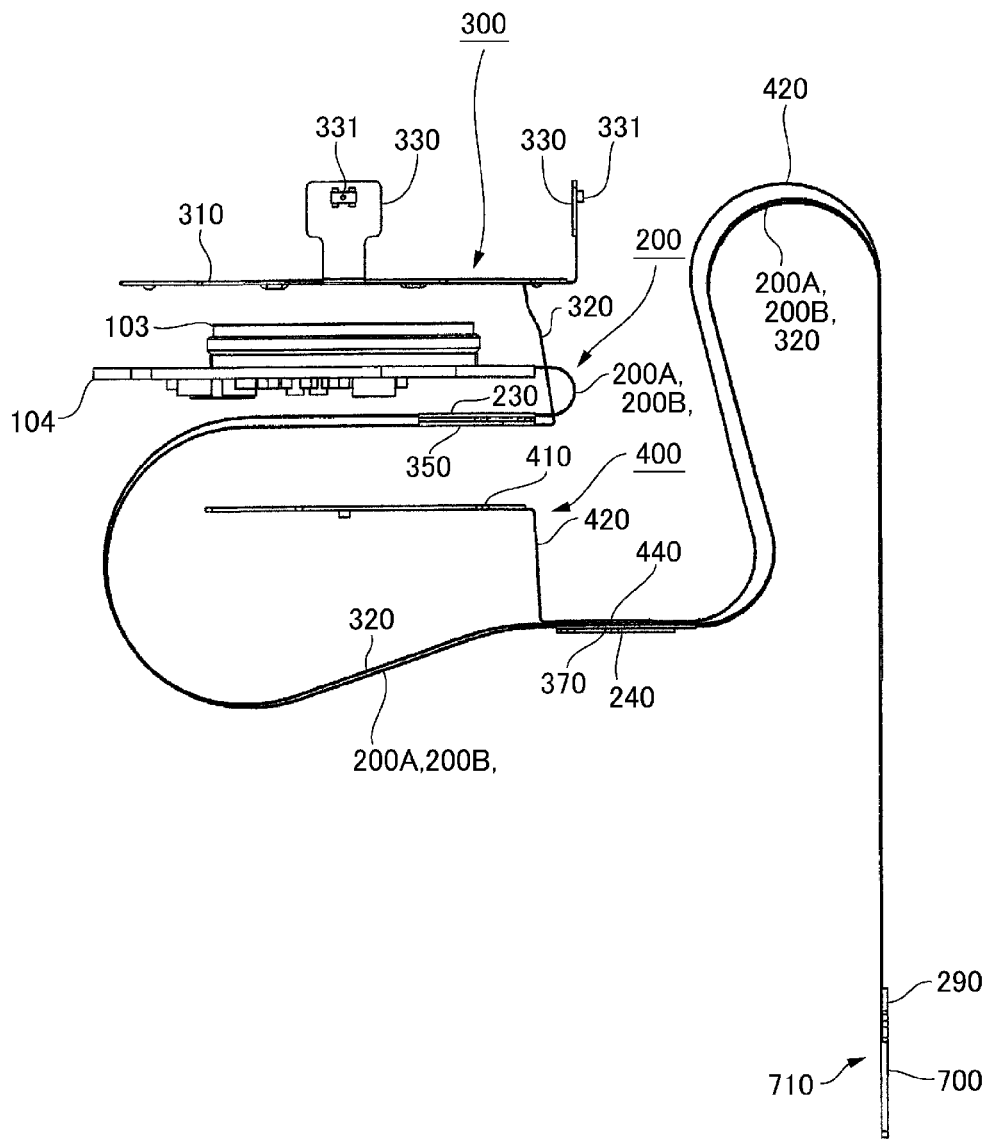
FIG. 12 is a side view showing a flexible printed circuit board.
Figure 13:
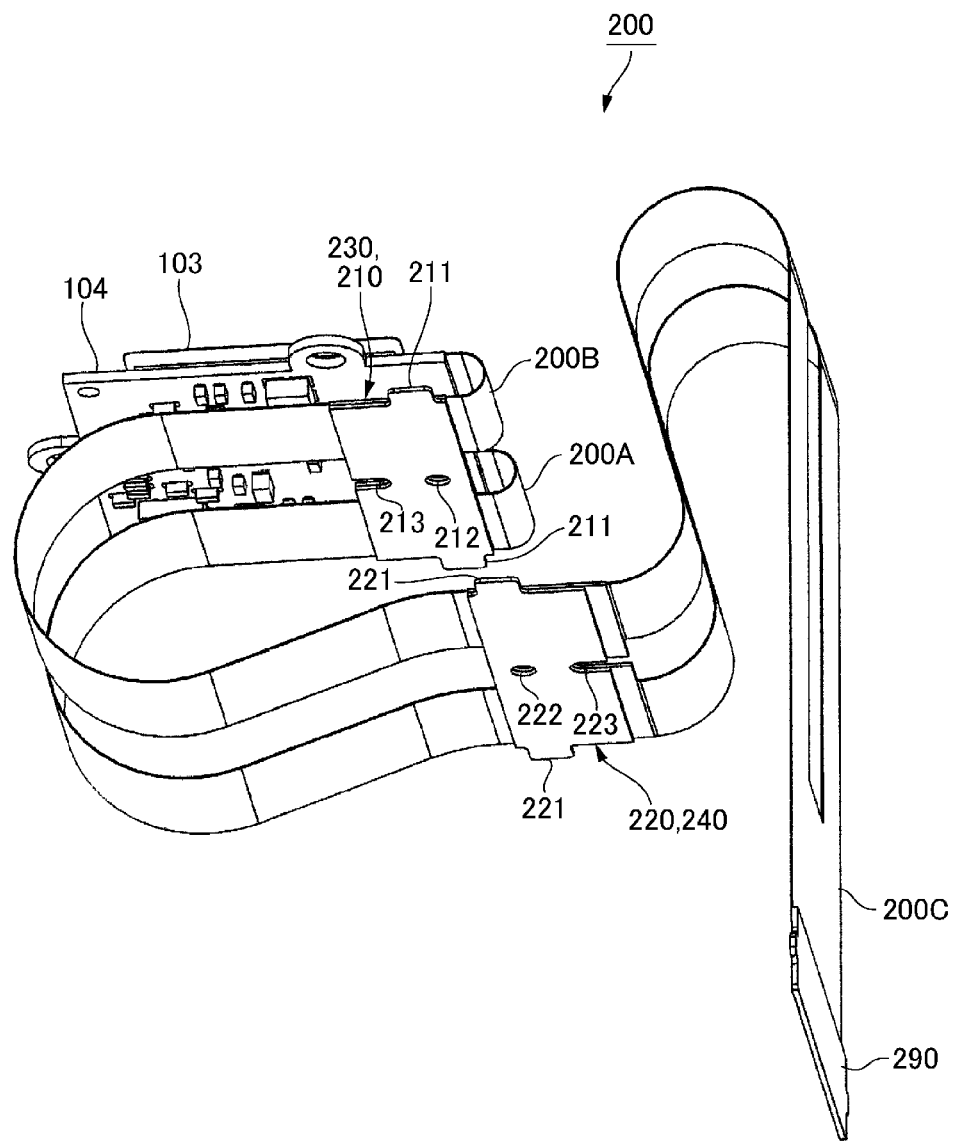
FIG. 13 is a perspective view showing a flexible printed circuit board which is connected to a camera module.
Figure 14:
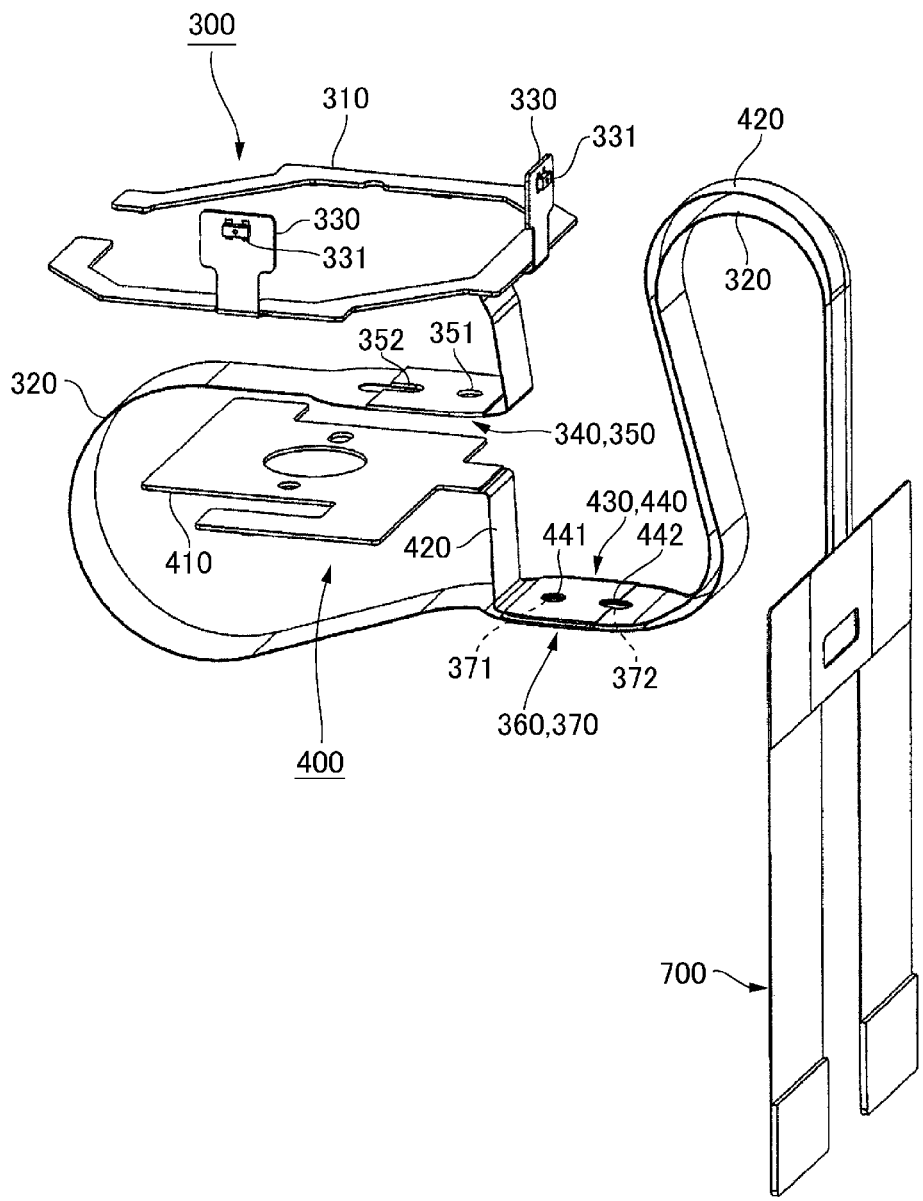
FIG. 14 is a perspective view showing a flexible printed circuit board which is connected with a magnetic swing drive mechanism and a magnetic rolling drive mechanism.

FIG. 12 is a side view showing the flexible printed circuit boards 200, 300 and 400. FIG. 13 is a perspective view showing the flexible printed circuit board 200 which is connected to the camera module 101. FIG. 14 is a perspective view showing the flexible printed circuit boards 300 and 400 which are connected with the magnetic swing drive mechanism 11 and the magnetic rolling drive mechanism 12. As shown in FIGS. 11 and 13, one end of the flexible printed circuit board 200 is connected with the circuit board 104 and its the other end is formed with a connector insertion part 290. The flexible printed circuit board 200 is provided with two flexible circuit board portions 200A and 200B which are connected with the circuit board 104. The two flexible circuit board portions 200A and 200B are connected with a flexible circuit board portion 200C having a wide width which is connected with the connector insertion part 290. The flexible circuit board portions 200A and 200B are fixed with a first reinforcing plate 210 at a fixed portion to the first movable body side fixing part 510 and a second reinforcing plate 220 at a fixed portion to the second movable body side fixing part 600.

The two flexible circuit board portions 200A and 200B are disposed in parallel to each other with a predetermined space in which the flexible printed circuit board 300 connected with the magnetic swing drive mechanism 11 is capable of being disposed. The first reinforcing plate 210 and the second reinforcing plate 220 are formed in a substantially rectangular plate shape whose longitudinal direction is set in a width direction of the flexible printed circuit board 200. The flexible circuit board portion 200A is fixed to one end in the longitudinal direction of each of the first reinforcing plate 210 and the second reinforcing plate 220, and the flexible circuit board portion 200B is fixed to the other ends in their longitudinal directions. In other words, the flexible circuit board portions 200A and 200B are held in a state with a predetermined constant space therebetween by the first reinforcing plate 210 and the second reinforcing plate 220.

The flexible printed circuit board 200 is provided with a first fixed part 230 which is fixed to the first movable body side fixing part 510 and a second fixed part 240 which is fixed to the second movable body side fixing part 600. The first fixed part 230 is structured by fixing the first reinforcing plate 210 to the flexible circuit board portions 200A and 200B. Further, the second fixed part 240 is structured by fixing the second reinforcing plate 220 to the flexible circuit board portions 200A and 200B. The first fixed part 230 is provided with hooked parts 211 formed at edges on both sides in the longitudinal direction of the first reinforcing plate 210 (in other words, the width direction of the flexible printed circuit board 200), and engagement holes 212 and 213 (engaging part) which are formed at a center in the longitudinal direction of the first reinforcing plate 210. Further, the second fixed part 240 is provided with hooked parts 221 formed at edges on both sides in the longitudinal direction of the second reinforcing plate 220 (in other words, the width direction of the flexible printed circuit board 200), and engagement holes 222 and 223 (engaging part) which are formed at a center in the longitudinal direction of the second reinforcing plate 220. The hooked parts 211 and 221 are protruded to an outer side in the width direction of the flexible circuit boards 200A and 200B.

Positions of the engagement holes 212 and 213 which are formed in the first reinforcing plate 210 are different from each other in a direction perpendicular to the width direction of the flexible printed circuit board 200. More specifically, the engagement hole 212 is a circular round hole which is formed in the vicinity of an edge on the circuit board 104 side of the first reinforcing plate 210, and the engagement hole 213 is formed at an edge on the connector insertion part 290 side. In this embodiment, the engagement hole 213 is an elongated groove formed in a cut-out shape which is cut out an edge on the connector insertion part 290 side of the first reinforcing plate 210, and the engagement hole 213 is connected with the space between the flexible circuit board portions 200A and 200B.

Similarly, positions of the engagement holes 222 and 223 which are formed in the second reinforcing plate 220 are different from each other in a direction perpendicular to the width direction of the flexible printed circuit board 200. More specifically, the engagement hole 222 is formed in the vicinity of an edge on the circuit board 104 side of the second reinforcing plate 220, and the engagement hole 223 is formed at an edge on the connector insertion part 290 side. In this embodiment, the engagement hole 223 is formed in a cut-out shape which is cut out an edge on the connector insertion part 290 side of the second reinforcing plate 220. In accordance with at least an embodiment of the present invention, the engagement holes 213 and 223 may be formed in an elongated hole shape instead of the cut-out groove shape described above.

As shown in FIGS. 12 and 14, the flexible printed circuit board 300 connected with the magnetic swing drive mechanism 11 is formed with a frame portion 310 connected with the swing drive coils 13 at one end, and the other end of the flexible printed circuit board 300 is connected with the connector insertion part 700 which is common to the flexible printed circuit board 400. The flexible printed circuit board 300 is provided with a flexible circuit board portion 320 connected with an inner peripheral edge of the frame portion 310 and sensor support parts 330 which are stood up from two positions of an outer peripheral edge of the frame portion 310. The frame portion 310 is fixed to the bottom plate part 115 of the camera module holder 102. A coil wire of the swing drive coil 13 is connected with a land (not shown) formed on the frame portion 310. A magnetic sensor 331 is fixed to the sensor support part 330. The magnetic sensor 331 detects a magnetic field of the swing drive magnet 14 facing the swing drive coil 13. In accordance with at least an embodiment of the present invention, a thermistor may be mounted on the sensor support part 330.

The flexible printed circuit board 300 is provided with a third fixed part 350 in which a third reinforcing plate 340 is fixed to the flexible circuit board portion 320, and a fourth fixed part 370 in which a fourth reinforcing plate 360 is fixed to the flexible circuit board portion 320. The third fixed part 350 is fixed to the first movable body side fixed part 510 in a state overlapped with the first fixed part 230 of the flexible printed circuit board 200, and the third fixed part 350 is provided with engagement holes 351 and 352 overlapped with the engagement holes 212 and 213 formed in the first reinforcing plate 210. Further, the fourth fixed part 370 is fixed to the second movable body side fixed part 600 in a state overlapped with the second fixed part 240 of the flexible printed circuit board 200, and is provided with engagement holes 371 and 372 overlapped with the engagement holes 222 and 223 formed in the second reinforcing plate 220.

As shown in FIGS. 12 and 14, the flexible printed circuit board 400 connected with the magnetic rolling drive mechanism 12 is formed with a plate-shaped part 410 connected with the rolling drive coils 15 at one end, and the other end of the flexible printed circuit board 400 is connected with the connector insertion part 700. The flexible printed circuit board 400 is provided with a flexible circuit board portion 420 which is extended between the plate-shaped part 410 and the connector insertion part 700. The flexible printed circuit board 400 is provided with a fifth fixed part 440 in which a fifth reinforcing plate 430 is fixed to the flexible circuit board portion 420. The fifth fixed part 440 is fixed to the second movable body side fixed part 600 in a state overlapped with the second fixed part 240 of the flexible printed circuit board 200 and the fourth fixed part 370 of the flexible printed circuit board 300. The fifth fixed part 440 is provided with engagement holes 441 and 442 overlapped with the engagement holes 222 and 223 and the engagement holes 371 and 372.

As shown in FIG. 1, the flexible circuit board portion 320 of the flexible printed circuit board 300 and the flexible circuit board portion 420 of the flexible printed circuit board 400 are extended so as to be disposed in a space between the flexible circuit board portions 200A and 200B of the flexible printed circuit board 200. Further, the connector insertion part 290 of the flexible printed circuit board 200 is fixed to the connector insertion part 700 of the flexible printed circuit boards 300 and 400 to structure the common connector insertion part 710. As shown in FIG. 11, an optical device main body on which the optical unit 1 is mounted includes a connector part 720 structured to connect the common connector insertion part 710. In other words, the flexible printed circuit boards 200, 300 and 400 are extended and disposed between the movable body 10 and a support body 730 in which the connector part 720 is provided. In this embodiment, the support body 730 is, for example, a portion such as a frame or a main circuit board of the optical device main body.

(Fixing Structure to First Movable Body Side Fixing Part)

Figure 15:
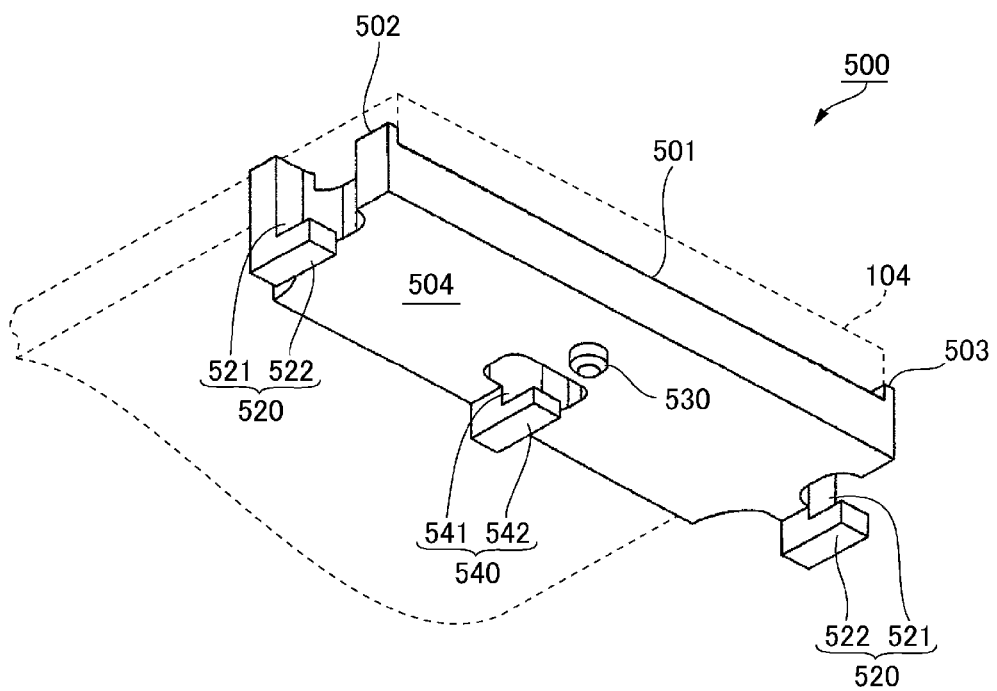
FIG. 15 is a perspective view showing a spacer which is viewed from a side of a first movable body side fixing part.
Figure 16:
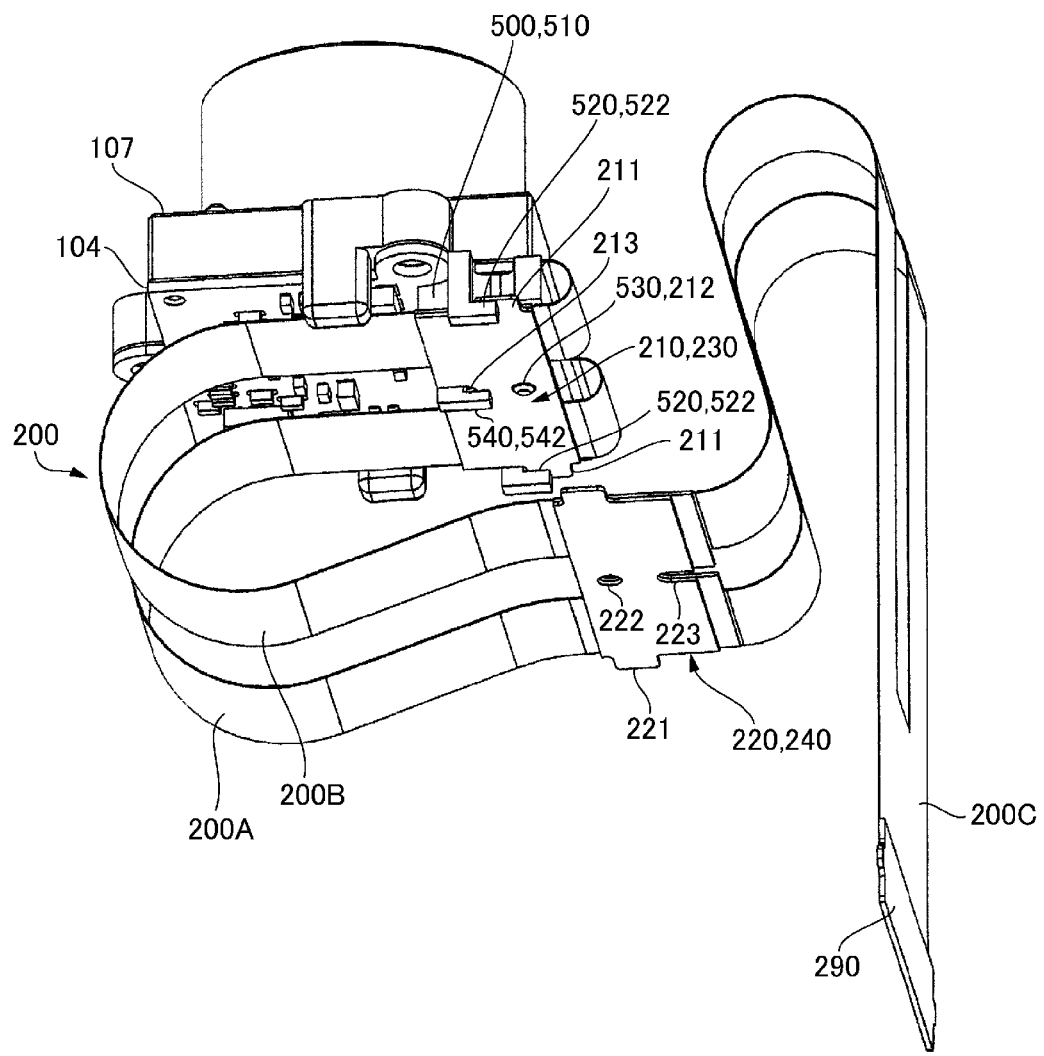
FIG. 16 is a perspective view showing a first movable body side fixing part to which a flexible printed circuit board is fixed.
Figure 17:
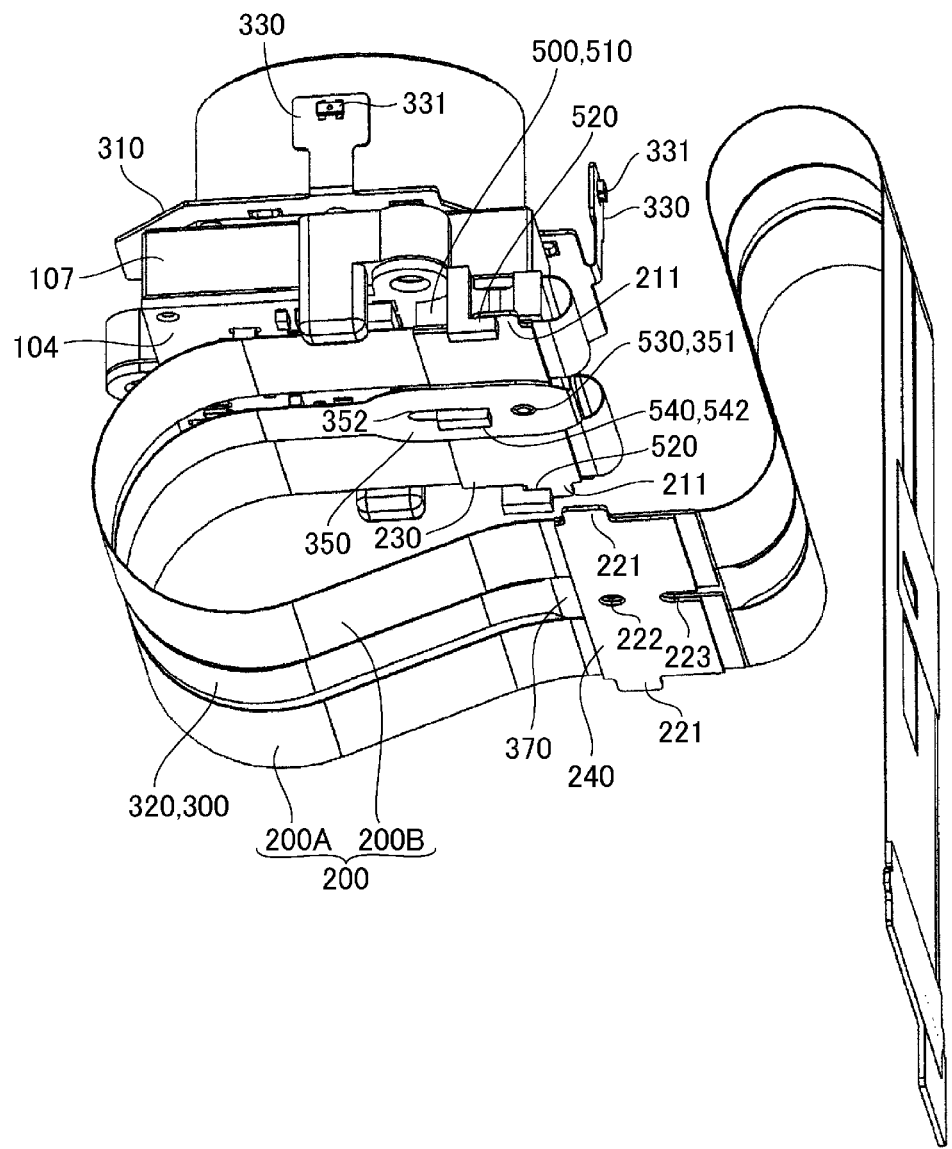
FIG. 17 is a perspective view showing a first movable body side fixing part to which flexible printed circuit boards are fixed.

FIG. 15 is a perspective view showing the spacer 500 which is viewed from a side of the first movable body side fixing part 510. FIG. 16 is a perspective view showing the first movable body side fixing part 510 to which the flexible printed circuit board 200 is fixed. FIG. 17 is a perspective view showing the first movable body side fixing part 510 to which the flexible printed circuit boards 200 and 300 are fixed. The spacer 500 is formed in a substantially rectangular solid shape as a whole and is fixed to an end part in the "+X" direction of the circuit board 104 in a state that its longitudinal direction is directed to the "Y" direction. The spacer 500 is provided with an attaching face 501 facing the "+Z" direction, and the attaching face 501 is formed with guide parts 502 and 503 along outward shapes of an edge in the "+Y" direction and an edge in the "−Y" direction of the circuit board 104. The guide parts 502 and 503 are protruded parts formed along an edge in the "+Y" direction and an edge in the "−Y" direction of the attaching face 501. The spacer 500 is attached to the circuit board 104 in a state positioned by the guide parts 502 and 503. The circuit board 104 is fitted to a groove-shaped recessed part formed of the guide parts 502 and 503 and the attaching face 501, and the circuit board 104 is abutted with the attaching face 501.

The first movable body side fixing part 510 is formed on a lower end face 504 which is an opposite side face to the attaching face 501 of the spacer 500. The first movable body side fixing part 510 is provided with two first hook parts 520 formed at both ends in the "Y" direction of the spacer 500, a protruded part 530 in a columnar shape which is protruded from a substantially center in the "Y" direction of the spacer 500, and a second hook part 540 which is located on the "−X" direction side with respect to the protruded part 530. In other words, the first movable body side fixing part 510 is provided with two protruded parts (protruded part 530 and second hook part 540) which are separated from each other in the "X" direction.

The first hook part 520 is formed in a bent shape which is provided with an abutting part 521 in a rectangular pillar shape which is protruded to the "−Z" direction from the lower end face 504 of the spacer 500, and a holding part 522 which is protruded so as to be bent from a tip end of the abutting part 521 in the "+X" direction. A space is formed between the holding part 522 of the first hook part 520 and the lower end face 504 of the spacer 500 so that the hooked part 211 formed in the first reinforcing plate 210 of the flexible printed circuit board 200 can be inserted. Further, the second hook part 540 is formed in a substantially same shape as the first hook part 520 and is formed in a bent shape provided with an abutting part 541 and a holding part 542.

When the first fixed part 230 of the flexible printed circuit board 200 is to be fixed to the first movable body side fixing part 510, the first reinforcing plate 210 is inclined so that an edge in the "+X" direction of the first reinforcing plate 210 is separated from the lower end face 504 and then, an edge in the "−X" direction of the first reinforcing plate 210 is slid to the "−X" direction along the lower end face 504. As a result, the hooked parts 211 of the first reinforcing plate 210 are inserted into between the first hook parts 520 and the lower end face 504 of the spacer 500, and the hooked parts 211 are supported and held by the holding parts 522. Further, the abutting part 541 of the second hook part 540 is inserted into the engagement hole 213 provided at an edge in the "−X" direction of the first reinforcing plate 210 and a center in the width direction ("Y" direction) of the first reinforcing plate 210 is supported and held by the holding part 542.

Positions of the first hook part 520 and the second hook part 540 are separated from each other in a direction perpendicular to the width direction (in other words, "Y" direction) of the flexible circuit board portions 200A and 200B, and the second hook part 540 is disposed on the "−X" direction side with respect to the first hook part 520. In other words, the positions of the first hook part 520 and the second hook part 540 are different from each other in an inserting direction when the first reinforcing plate 210 is inserted (in other words, "X" direction).

In a case that the first reinforcing plate 210 is to be inserted into the first hook parts 520 and the second hook part 540, when the first reinforcing plate 210 is abutted with the abutting parts 521 of the first hook parts 520 and the abutting part 541 of the second hook part 540, the first reinforcing plate 210 is positioned at a position where the protruded part 530 protruded from the lower end face 504 of the spacer 500 and the engagement hole 212 are overlapped with each other. Therefore, the protruded part 530 is fitted into the engagement hole 212 so that the first fixed part 230 is abutted with the lower end face 504. As a result, as shown in FIG. 16, the first fixed part 230 of the flexible printed circuit board 200 is fixed to the first movable body side fixing part 510 in a positioned state.

Next, as shown in FIG. 17, the third fixed part 350 of the flexible printed circuit board 300 is overlapped with the center in the width direction of the first fixed part 230, and the third fixed part 350 is fixed to the protruded part 530 and the second hook part 540 of the first movable body side fixing part 510. The engagement holes 351 and 352 formed in the third fixed part 350 are formed at positions corresponding to the protruded part 530 and the second hook part 540. The engagement hole 352 located on the "−X" direction side is formed in an elongated hole shape into which the second hook part 540 is capable of being inserted. When the second hook part 540 is inserted into the engagement hole 352 and the third fixed part 350 is slid to the "−X" direction, the third reinforcing plate 340 is held by the holding part 542 of the second hook part 540 in a state that the first reinforcing plate 210 is sandwiched between the lower end face 504 of the spacer 500 and the third reinforcing plate 340. Therefore, the holding part 542 of the second hook part 540 holds the third reinforcing plate 340 together with the first reinforcing plate 210. In this case, when the abutting part 541 of the second hook part 540 is abutted with an edge in the "+X" direction of the engagement hole 352 which is an elongated hole, the third reinforcing plate 340 is positioned at a position where the protruded part 530 and the engagement hole 351 are overlapped with each other. In this state, when the tip end of the protruded part 530 is fitted into the circular engagement hole 351, the third fixed part 350 of the flexible printed circuit board 300 is fixed to the first movable body side fixing part 510.

In the first fixed part 230 of the flexible printed circuit board 200 and the third fixed part 350 of the flexible printed circuit board 300, a pair of the engagement holes 212 and 213 and a pair of the engagement holes 351 and 352 which are engaged with the protruded part 530 and the second hook part 540 of the first movable body side fixing part 510 are provided as reference holes for engaging the engagement holes 212 and 351 located on the "+X" direction side with the protruded part 530 in a columnar shape.

(Fixing Structure to Second Movable Body Side Fixing Part)

Figure 18:
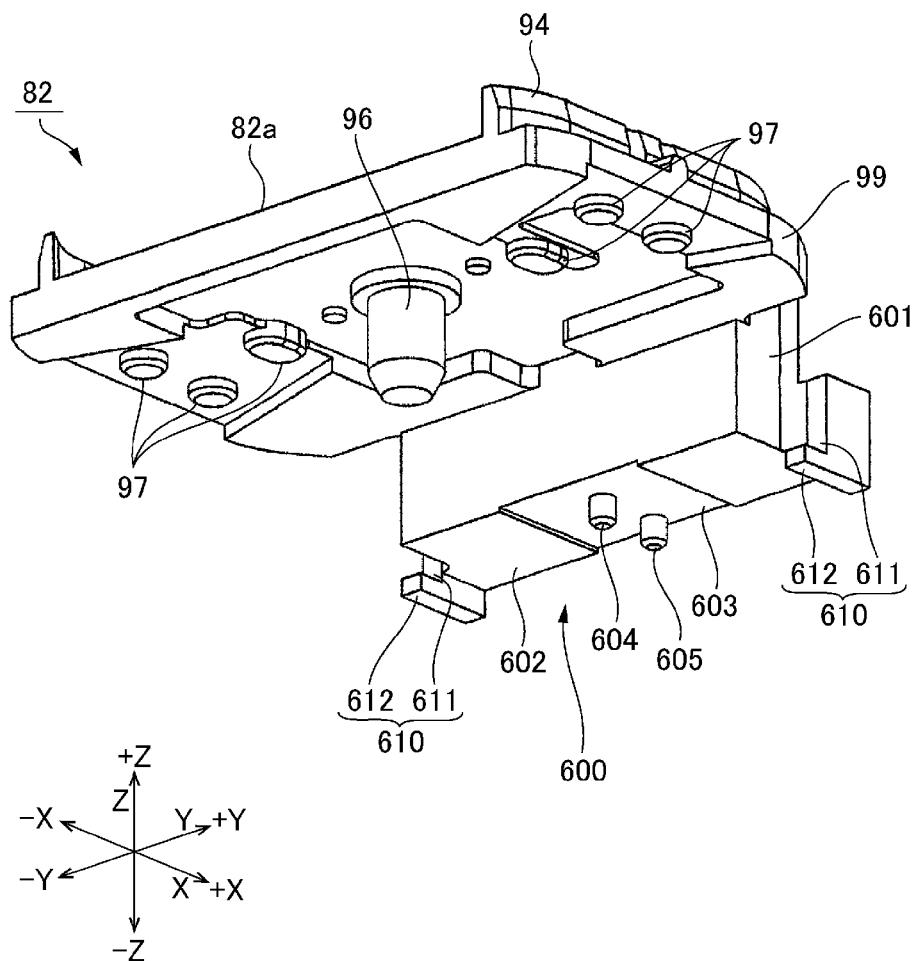
FIG. 18 is a perspective view showing a holder bottom plate member which is viewed from a side of a second movable body side fixing part.
Figure 19:
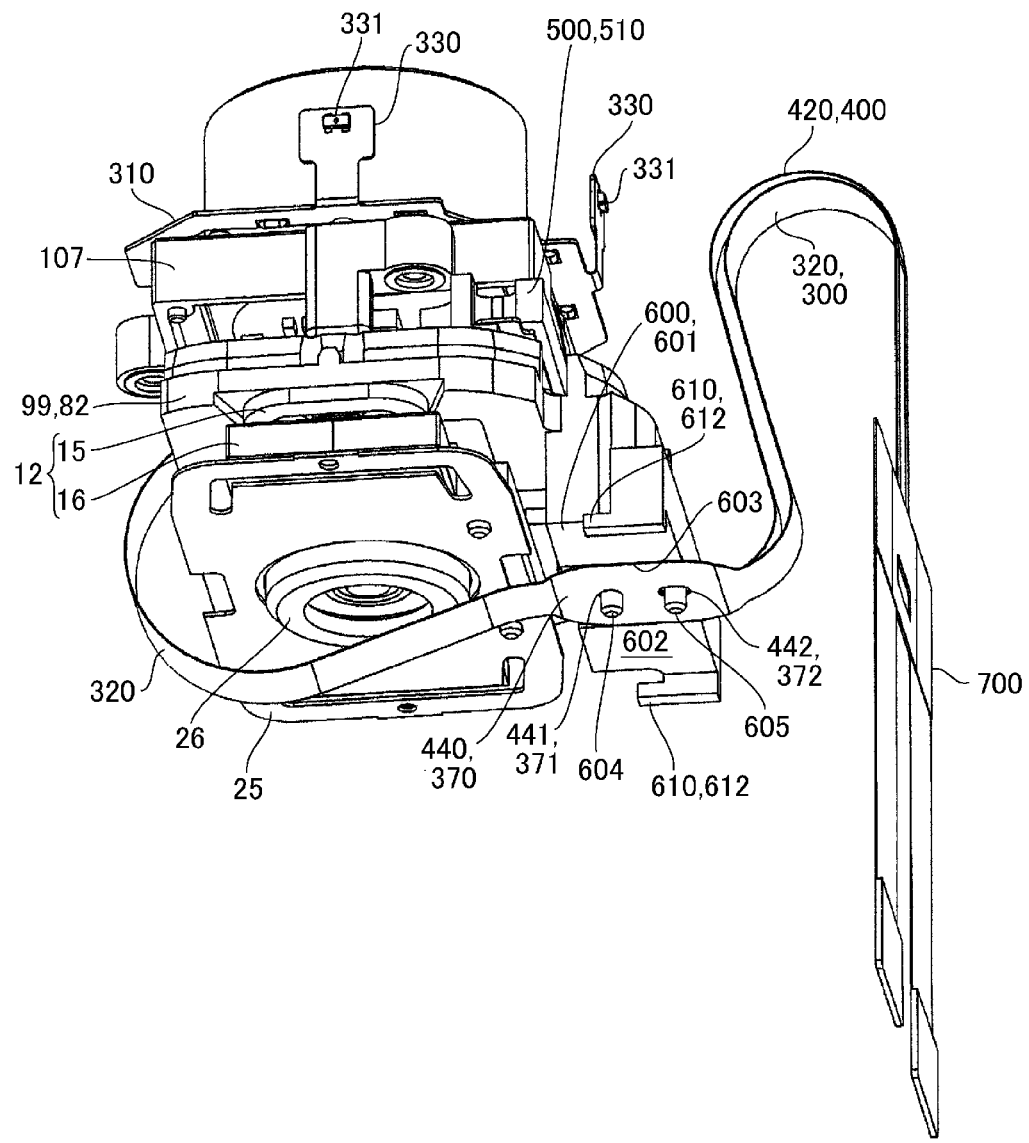
FIG. 19 is a perspective view showing a second movable body side fixing part to which flexible printed circuit boards are fixed.
Figure 20:
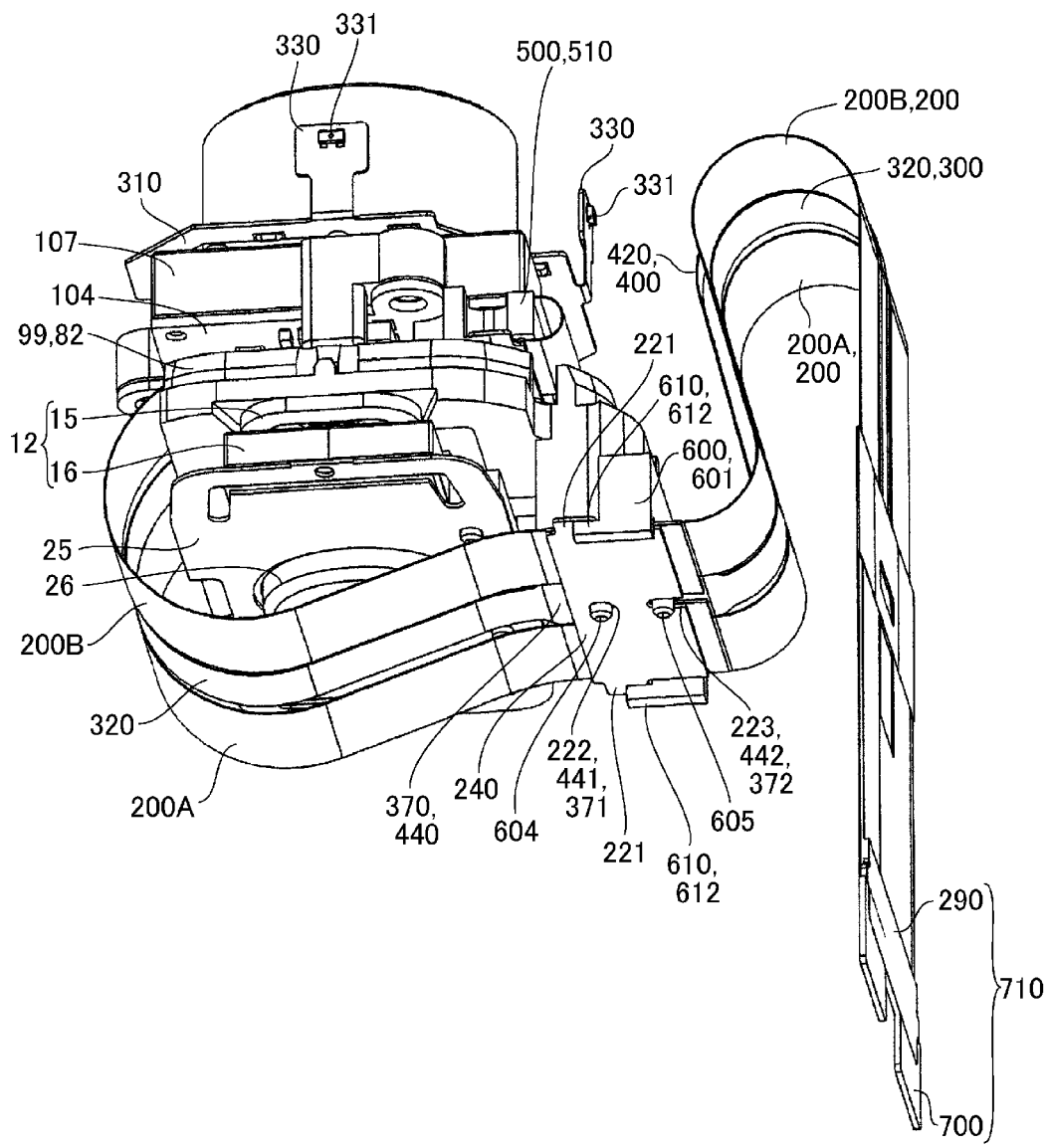
FIG. 20 is a perspective view showing a second movable body side fixing part to which flexible printed circuit boards are fixed.

FIG. 18 is a perspective view showing the holder bottom plate member 82 which is viewed from a side of the second movable body side fixing part 600. FIG. 19 is a perspective view showing the second movable body side fixing part 600 to which the flexible printed circuit boards 300 and 400 are fixed. FIG. 20 is a perspective view showing the second movable body side fixing part 600 to which the flexible printed circuit boards 200, 300 and 400 are fixed. As shown in FIG. 18, the holder bottom plate member 82 is provided with a bottom plate part 99, which is provided with a shaft part 96 protruded to the "−Z" direction and is formed with a rolling drive coil holding part 97, and a protruded part 601 which is formed at an edge in the "+X" direction of the bottom plate part 99. The protruded part 601 is formed in a rectangular solid shape which is long in the "Y" direction and is protruded from the bottom plate part 99 to the "−Z" direction. The second movable body side fixing part 600 is provided on a lower end face 602 of the protruded part 601. The bottom plate part 99 is formed with a recessed part for disposing a plate-shaped part 410 of the flexible printed circuit board 400 around the shaft part 96. The plate-shaped part 410 is connected with coil wires of the rolling drive coils 15 which are held by the rolling drive coil holding parts 97.

As shown in FIG. 11, the flexible circuit board portion 420 of the flexible printed circuit board 400 is bent to the "−Z" direction from an edge in the "+X" direction of the plate-shaped part 410 and is extended to the second movable body side fixing part 600 along a side face on the "−X" direction side of the protruded part 601. The second movable body side fixing part 600 is provided with a groove part 603 formed in the lower end face 602 of the protruded part 601, two protruded parts 604 and 605 protruded from a bottom face of the groove part 603, and two third hook parts 610 which are formed at both ends in the "Y" direction of the protruded part 601. The protruded parts 604 and 605 are formed in a columnar shape and are disposed at positions separated from each other in the "X" direction. The groove part 603 is provided with a width and a depth capable of accommodating the fifth fixed part 440 of the flexible printed circuit board 400 and the fourth fixed part 370 of the flexible printed circuit board 300 in an overlapped state. When the flexible printed circuit boards 200, 300 and 400 are to be fixed to the second movable body side fixing part 600, as shown in FIG. 19, the fifth fixed part 440 of the flexible printed circuit board 400 is disposed in the groove part 603 and the protruded parts 604 and 605 are fitted into the engagement holes 441 and 442. After that, the fourth fixed part 370 of the flexible printed circuit board 300 is disposed in the groove part 603 in an overlapped state with the fifth fixed part 440, and the protruded parts 604 and 605 are fitted into the engagement holes 371 and 372.

The third hook part 610 is formed in a bent shape which is provided with an abutting part 611 in a rectangular pillar shape which is protruded to the "−Z" direction with respect to the lower end face 602 of the protruded part 601, and a holding part 612 which is bent and protruded to the "−X" direction from a tip end of the abutting part 611. A space is formed between the holding part 612 of the third hook part 610 and the lower end face 602 of the protruded part 601 so that the hooked part 221 formed in the second reinforcing plate 220 of the flexible printed circuit board 200 can be inserted.

A method in which the second fixed part 240 of the flexible printed circuit board 200 is fixed to the second movable body side fixing part 600 is substantially similar to the method in which the first fixed part 230 is fixed to the first movable body side fixing part 510. In other words, the second reinforcing plate 220 is inclined so that an edge on the "−X" direction of the second reinforcing plate 220 is separated from the lower end face 602 and then, an edge on the "+X" direction of the second reinforcing plate 220 is moved so as to slide to the "+X" direction along the lower end face 602. As a result, the hooked parts 221 provided at both ends in the width direction of the second reinforcing plate 220 are inserted between the third hook parts 610 and the lower end face 602 of the protruded part 601 and the hooked parts 221 are held by the holding parts 612. Further, when the hooked parts 221 are abutted with the abutting parts 611 of the third hook parts 610, the second reinforcing plate 220 is positioned. Further, the protruded part 605 is disposed in the engagement hole 223 provided at an edge in the "+X" direction of the second reinforcing plate 220 and the protruded part 605 is abutted with an edge of the engagement hole 223.

In this state, when the protruded part 604 is fitted into the engagement hole 222 provided in the second fixed part 240, the second fixed part 240 of the flexible printed circuit board 200 is fixed to the second movable body side fixing part 600. Further, the fifth fixed part 440 and the fourth fixed part 370 of the flexible printed circuit boards 400 and 300 are held by the second fixed part 240 of the flexible printed circuit board 200.

(Principal Operations and Effects in this Embodiment)

As described above, in the optical unit 1 in this embodiment, the flexible printed circuit board 200 for the camera module 101 is provided with the first fixed part 230 which is reinforced by the first reinforcing plate 210. The first fixed part 230 is provided with the two engagement holes 212 and 213, which are formed at a center in the width direction (in other words, a direction perpendicular to the direction where the flexible printed circuit board 200 is extended), and the hooked parts 211 which are end parts of the first reinforcing plate 210 protruded to both ends in the width direction. On the other hand, the first movable body side fixing part 510 is provided in the movable body 10 and thus, the hooked parts 211 are inserted into the first hook parts 520 of the first movable body side fixing part 510, an edge of the engagement hole 213 is inserted to the second hook part 540 of the first movable body side fixing part 510 and, in addition, the protruded part 530 of the first movable body side fixing part 510 is fitted into the engagement hole 212 and, as a result, the first fixed part 230 is fixed. The fixing structure does not require fixing components different from the movable body 10 and the flexible printed circuit board 200 and thus the number of components can be reduced. Further, fixing work is easily performed. In addition, when engaging states of the first hook parts 520 with the hooked parts 211 are to be confirmed by visual inspection and, when fitting states of the protruded part 530 and the second hook part 540 to the engagement holes 212 and 213 are to be confirmed by visual inspection, attached portions can be confirmed by observing from an upper side. Therefore, the fixed state is easily confirmed.

In this embodiment, one (engagement hole 213) of the engagement holes 212 and 213 is engaged with the second hook part 540 which is not a simple protruded part. Therefore, both ends in the width direction of the first reinforcing plate 210 are held by the first hook parts 520 and, in addition, the center in the width direction of the first reinforcing plate 210 is held by the second hook part 540. Accordingly, the first reinforcing plate 210 can be further surely fixed. Further, the other engagement hole 212 is a reference hole to which the protruded part 530 is fitted. Therefore, the first fixed part 230 can be positioned and thus positional displacement of the first fixed part 230 is prevented in the extending direction of the flexible printed circuit board 200. In accordance with at least an embodiment of the present invention, the second hook part 540 may be formed as a simple protruded part. Further, the second hook part 540 and the engagement hole 213 may be omitted.

The first hook part 520 and the second hook part 540 in this embodiment are provided with the abutting parts 521 and 541 with which the first reinforcing plate 210 is abutted, and the holding parts 522 and 542 which are protruded to the same direction from the abutting parts 521 and 541. Therefore, the first reinforcing plate 210 can be inserted to the first hook part 520 and the second hook part 540 in the same direction and thus, fixing work is easily performed. Further, the first reinforcing plate 210 can be positioned by abutting the first reinforcing plate 210 with the abutting parts 521 and 541 and thus positioning of the first fixed part 230 is easily performed. Further, the first hook part 520 and the second hook part 540 are provided so that their positions are separated from each other in a direction where the first reinforcing plate 210 is inserted ("X" direction: the flexible printed circuit board 200 is extended) and thus the first reinforcing plate 210 is hard to be disengaged from the first hook part 520 and the second hook part 540. Therefore, fixing of the first fixed part 230 to the first movable body side fixing part 510 is hard to be disengaged. Further, the flexible printed circuit board 200 can be prevented from being inclined with respect to the "X" direction (extended direction) and, in addition, lateral displacement of the flexible printed circuit board 200 in a direction perpendicular to the extended direction can be prevented.

In this embodiment, in the movable body 10, the spacer 500 is fixed to the circuit board 104 (module circuit board) on which electronic components of the camera module 101 is mounted and the first movable body side fixing part 510 is formed in the spacer 500. Specifically, the first hook parts 520, the second hook part 540 and the protruded part 530 are formed in the lower end face 504 of the spacer 500. As described above, when the spacer 500 is attached to the circuit board 104 and the flexible printed circuit board 200 is fixed to the spacer 500, the flexible printed circuit board 200 can be fixed at a position close to the circuit board 104. Further, an interference between the electronic components mounted on the circuit board 104 and the flexible printed circuit board 200 can be prevented. In addition, the spacer 500 is provided with the guide parts 502 and 503 along the outward shape of the circuit board 104 and thus positioning of the circuit board 104 can be accurately and easily performed.

In this embodiment, the flexible printed circuit board 200 comprises a plurality of the flexible circuit boards 200A and 200B which are divided in its width direction instead of using one flexible circuit board having a wide width. When the flexible circuit board is divided, the flexible printed circuit board 200 can be easily bent resiliently. For example, in a case that the camera module 101 is swung or turned so that the flexible printed circuit board 200 is twisted, when the flexible printed circuit board 200 is divided into a plurality of the flexible circuit boards, the flexible printed circuit boards are easily bent resiliently. Therefore, when the camera module 101 is swung or turned, a resistance force of the flexible printed circuit board 200 can be reduced.

The optical unit 1 in this embodiment includes the flexible printed circuit board 200 (optical module printed circuit board) connected with the camera module 101 and the flexible printed circuit board 300 (drive mechanism printed circuit board) which is connected with the magnetic swing drive mechanism 11 structured to swing the camera module 101. The flexible printed circuit board 300 is provided with the third fixed part 350 which is fixed to the first movable body side fixing part 510 through the protruded part 530 and the second hook part 540 of the first movable body side fixing part 510. Therefore, the plurality of the flexible printed circuit boards 200 and 300 can be collectively fixed to the first movable body side fixing part 510 by using a common fixing structure. Further, the plurality of the flexible printed circuit boards 200 and 300 can be collectively extended around.

In this embodiment, another fixing structure similar to the fixing structure of the first fixed part 230 and the first movable body side fixing part 510 is also provided. In other words, the flexible printed circuit board 200 is provided with the second fixed part 240 between the first fixed part 230 and the connector insertion part 290 and the movable body 10 is provided with the second movable body side fixing part 600 to which the second fixed part 240 is fixed. Therefore, similar operations and effects are obtained at two positions. Further, the second movable body side fixing part 600 is fixed with the fourth fixed part 370 of the flexible printed circuit board 300 and the fifth fixed part 440 of the flexible printed circuit board 400 (drive mechanism printed circuit board) which is connected with the magnetic rolling drive mechanism 12 in addition to the second fixed part 240 of the flexible printed circuit board 200. Therefore, the three flexible printed circuit boards 200, 300 and 400 can be collectively fixed and the three flexible printed circuit boards 200, 300 and 400 can be collectively extended around.

In this embodiment, in order that the flexible printed circuit boards 200, 300 and 400 are collectively extended around, it is structured that the flexible printed circuit boards 300 and 400 are disposed between the two flexible circuit boards 200A and 200B which structure the flexible printed circuit board 200, and that the engaging part (engagement holes 212 and 213) formed in the first reinforcing plate 210 provided between the flexible circuit boards 200A and 200B is overlapped with the flexible printed circuit boards 300 and 400. Therefore, the flexible printed circuit board 200 for the camera module 101 and the flexible printed circuit boards 300 and 400 for the drive mechanisms can be extended around so as not to be overlapped with each other. Further, in order that the flexible circuit board portions 320 and 420 of the flexible printed circuit boards 300 and 400 are extended around in "U"-shapes in an overlapped state between the second movable body side fixing part 600 and the common connector insertion part 710, a length of the flexible circuit board portion 320 disposed on an inner side is set to be shorter than a length of the flexible circuit board portion 420 disposed on an outer side. Therefore, a space is formed between the flexible circuit board portions 320 and 420 (see FIGS. 1 and 11). Accordingly, when the movable body 10 is to be turned around the axial line "L", deformations of the flexible circuit board portions 320 and 420 cannot be disturbed.

(Other Embodiments)

In the embodiment described above, the rolling drive coils 15 of the magnetic rolling drive mechanism 12 are mounted on the movable body 10 and the rolling drive magnets 16 are mounted on the fixed body 8. However, it may be structured that the rolling drive magnets 16 are mounted on the movable body 10 and the rolling drive coils 15 are mounted on the fixed body 8. In this case, the flexible printed circuit board 400 is not required to be connected with the movable body 10. Therefore, the flexible printed circuit board 400 is easily attached and thus the optical unit 1 is easily manufactured. Further, when the movable body 10 is to be turned in a rolling direction, a movement of the movable body 10 is not obstructed by the flexible printed circuit board 400.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An optical unit with a shake correction function comprising:
   an optical module;
   a movable body on which the optical module is mounted;
   a fixed body which supports the movable body; and
   a flexible printed circuit board which is connected with the movable body;
   wherein the flexible printed circuit board comprises an optical module printed circuit board connected with the optical module and a drive mechanism printed circuit board which is connected with a drive mechanism structured to swing or turn the optical module,
   wherein the optical module printed circuit board comprises a fixed part which is fixed to the movable body, the fixed part being structured by fixing a reinforcing plate to the flexible printed circuit board;
   wherein the fixed part comprises two engaging parts to which two protruded parts formed in the movable body are fitted and a hooked part formed of an end part of the reinforcing plate, the hooked part being protruded to an outer side in a width direction of the flexible circuit board; and
   wherein the movable body comprises the two protruded parts which are fitted to the two engaging parts and a first hook part which holds the hooked part.

2. The optical unit with a shake correction function according to claim 1, wherein one of the two protruded parts is a second hook part which holds the reinforcing plate.

3. The optical unit with a shake correction function according to claim 2, wherein each of the first hook part and the second hook part comprises an abutting part which is capable of abutting with the reinforcing plate and a holding part which is protruded from the abutting part, the holding parts of the first hook part and the second hook part are protruded to the same direction as each other.

4. The optical unit with a shake correction function according to claim 2, wherein positions of the first hook part and the second hook part are different from each other in a direction perpendicular to a width direction of the flexible printed circuit board.

5. The optical unit with a shake correction function according to claim 1, wherein
   the movable body comprises a circuit board on which an electronic component of the optical module is mounted and a spacer which is fixed to the circuit board, and
   the two protruded parts and the first hook part are formed in the spacer.

6. The optical unit with a shake correction function according to claim 5, wherein
   the spacer comprises a guide part along an outward shape of the circuit board, and
   the spacer is attached to the circuit board in a state positioned by the guide part.

7. The optical unit with a shake correction function according to claim 5, wherein
   the spacer is fixed to one end of the circuit board,
   the optical module printed circuit board is extended from the one end of the circuit board and is turned around to an opposite side to a one end, and
   the fixed part is located at a position along the spacer.

8. The optical unit with a shake correction function according to claim 5, wherein
   the two engaging parts are an elongated groove in a cut-out shape, which is formed by cutting out an edge of the reinforcing plate, and a circular engagement hole whose position is shifted with respect to the elongated groove in a direction perpendicular to a width direction of the flexible printed circuit board, and
   the two protruded parts in the spacer are a second hook part, which is protruded to an opposite side to the circuit board and is structured so as to hold the reinforcing plate, and a columnar protruded part which is protruded to the opposite side to the circuit board and is engaged with the circular engagement hole in the reinforcing plate.

9. The optical unit with a shake correction function according to claim 8, wherein
   the first hook part in the spacer comprises an abutting part which is abutted with the reinforcing plate and a holding part which is protruded from the abutting part, and
   in a state that the reinforcing plate is abutted with the abutting part of the first hook part, the columnar protruded part is overlapped with the circular engagement hole and the circular engagement hole and the columnar protruded part are engaged with each other.

10. The optical unit with a shake correction function according to claim 9, wherein positions of the first hook part and the second hook part are different from each other in a direction perpendicular to a width direction of the flexible printed circuit board.

11. The optical unit with a shake correction function according to claim 1, wherein the optical module printed circuit board comprises a plurality of the flexible circuit boards.

12. The optical unit with a shake correction function according to claim 1, wherein
the drive mechanism printed circuit board is fixed to the movable body through the protruded parts.

13. The optical unit with a shake correction function according to claim 12, wherein
the movable body comprises:
a swing body on which the optical module having an optical element is mounted;
a swing support mechanism structured to swingably support the swing body; and
a holder which supports the swing body through the swing support mechanism,
the two protruded parts and the first hook part are provided in the swing body,
the optical module printed circuit board comprises a power feeding line for the optical module and a signal line for outputting a signal from the optical module to an outer side, and
the hooked part provided in the fixed part of the optical module printed circuit board is held by the first hook part provided in the swing body, and the two engaging parts are fitted to the two protruded parts, and thereby the optical module printed circuit board is fixed to the swing body.

14. The optical unit with a shake correction function according to claim 13, wherein
the swing body comprises a circuit board on which an electronic component of the optical module is mounted and a spacer which is fixed to the circuit board,
the optical module printed circuit board is connected with the circuit board and,
the spacer is structured in a substantially rectangular solid shape,
the two protruded parts are provided at a substantially center in a longitudinal direction of the spacer in the substantially rectangular solid shape,
the first hook part is provided at both ends in the longitudinal direction of the spacer, and
the hooked parts protruded from both end parts of the reinforcing plate of the optical module printed circuit board are held by the first hook parts provided at the both ends of the spacer, and the two engaging parts provided in the fixed part of the optical module printed circuit board are fitted to the two protruded parts provided at the substantially center of the spacer, and thereby the optical module printed circuit board is fixed to the spacer.

15. The optical unit with a shake correction function according to claim 13, wherein one of the two protruded parts is a second hook part which holds the reinforcing plate.

16. The optical unit with a shake correction function according to claim 15, wherein the first hook part comprises an abutting part which is abutted with the reinforcing plate and a holding part which is protruded from the abutting part.

17. The optical unit with a shake correction function according to claim 16, wherein positions of the first hook part and the second hook part are different from each other in a direction perpendicular to a width direction of the flexible printed circuit board.

18. The optical unit with a shake correction function according to claim 12, wherein
the optical module printed circuit board comprises two pieces of the flexible circuit boards which are separated in the width direction of the optical module printed circuit board, and
the drive mechanism printed circuit board is disposed between the two flexible circuit boards and is overlapped with the engaging parts formed in the reinforcing plate, the engaging parts being located between the two flexible circuit boards.

19. The optical unit with a shake correction function according to claim 18, wherein
the movable body comprises:
a swing body on which the optical module having an optical element is mounted;
a swing support mechanism structured to swingably support the swing body; and
a holder which supports the swing body through the swing support mechanism;
the swing body comprises a circuit board on which an electronic component of the optical module is mounted and a spacer which is fixed to the circuit board,
the two flexible circuit boards of the optical module printed circuit board are connected with the circuit board,
the spacer is structured in a substantially rectangular solid shape,
the two protruded parts are provided at a substantially center in a longitudinal direction of the spacer in the substantially rectangular solid shape,
the first hook part is provided at both ends in the longitudinal direction of the spacer,
the hooked parts protruded from both end parts of the reinforcing plate of the optical module printed circuit board are held by the first hook parts provided at the both ends of the spacer, and the two engaging parts provided in the fixed part of the optical module printed circuit board are fitted to the two protruded parts provided at the substantially center of the spacer, and thereby the optical module printed circuit board is fixed to the spacer.

20. The optical unit with a shake correction function according to claim 19, wherein
the drive mechanism comprises a magnetic swing drive mechanism which comprises a swing drive coil held by the swing body and is structured to swing the swing body, and
the drive mechanism printed circuit board is connected with the swing drive coil and is fixed by the two protruded parts formed in the spacer.

* * * * *